(12) United States Patent
Cho et al.

(10) Patent No.: US 7,371,638 B2
(45) Date of Patent: May 13, 2008

(54) NONVOLATILE MEMORY CELLS HAVING HIGH CONTROL GATE COUPLING RATIOS USING GROOVED FLOATING GATES AND METHODS OF FORMING SAME

(75) Inventors: Eun-Suk Cho, Gyeonggi-do (KR);
Choong-Ho Lee, Gyeonggi-do (KR);
Tae-Yong Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 335 days.

(21) Appl. No.: 11/121,887

(22) Filed: May 4, 2005

(65) Prior Publication Data

US 2005/0260814 A1  Nov. 24, 2005

(30) Foreign Application Priority Data

May 24, 2004   (KR)   .................. 10-2004-0037050
May 31, 2004   (KR)   .................. 10-2004-0039374

(51) Int. Cl.
*H01L 21/336* (2006.01)
(52) U.S. Cl. .................. 438/257; 438/259; 438/593
(58) Field of Classification Search ................ 438/257, 438/259, 264, 593–594, 696, 719
See application file for complete search history.

(56) References Cited

U.S. PATENT DOCUMENTS

| 6,468,862 | B1 | 10/2002 | Tseng |
| 7,005,700 | B2 | 2/2006 | Lee |
| 2002/0093073 | A1 | 7/2002 | Mori et al. |
| 2003/0042531 | A1 | 3/2003 | Jong |
| 2003/0151077 | A1 | 8/2003 | Mathew |
| 2005/0205924 | A1 * | 9/2005 | Yoon et al. .................. 257/317 |
| 2005/0227435 | A1 | 10/2005 | Oh et al. |
| 2005/0266638 | A1 | 12/2005 | Cho et al. |
| 2005/0272192 | A1 | 12/2005 | Oh et al. |

FOREIGN PATENT DOCUMENTS

| JP | 2002-118186 | 4/2002 |
| JP | 2003-204068 | 7/2003 |
| JP | 2003-224215 | 8/2003 |
| KR | 1998-025547 | 7/1998 |
| KR | 10-0199369 | 3/1999 |
| KR | 1020010003086 A | 1/2001 |
| KR | 1020020059473 A | 7/2002 |
| KR | 1020030087293 A | 11/2003 |

* cited by examiner

*Primary Examiner*—Zandra V. Smith
*Assistant Examiner*—Toniae M Thomas
(74) *Attorney, Agent, or Firm*—Myers Bigel Sibley & Sajovec

(57) ABSTRACT

A non-volatile memory cell includes a semiconductor substrate having a fin-shaped active region extending therefrom. A tunnel dielectric layer is provided, which extends on opposing sidewalls and an upper surface of the fin-shaped active region. A floating gate electrode is provided on the tunnel dielectric layer. This floating gate electrode has at least a partial groove therein. An inter-gate dielectric layer is also provided. This inter-gate dielectric layer extends on the floating gate electrode and into the at least a partial groove. A control gate electrode is provided, which extends on the inter-gate dielectric layer and into the at least a partial groove.

13 Claims, 24 Drawing Sheets

NONVOLATILE MEMORY CELLS HAVING HIGH CONTROL GATE COUPLING RATIOS USING GROOVED FLOATING GATES AND METHODS OF FORMING SAME

REFERENCE TO PRIORITY APPLICATION

This application claims priority to Korean Patent Application No. 2004-37050, filed May 24, 2004, and Korean Patent Application No. 2004-39374, filed May 31, 2004, the disclosures of which are hereby incorporated herein by reference.

FIELD OF THE INVENTION

The present invention relates to memory device and methods of forming memory devices and, more particularly, to nonvolatile memory devices and methods of forming nonvolatile memory devices.

BACKGROUND OF THE INVENTION

Semiconductor memory devices that store data can be categorized as either volatile memory devices or nonvolatile memory devices. Volatile memory devices lose stored data when power is interrupted, whereas nonvolatile memory devices retain stored data even if the power is abruptly interrupted. Nonvolatile memory devices include flash memory devices. A unit cell of a conventional flash memory device (hereinafter, referred to as a "flash memory cell") can include an active region defined at a predetermined region of a semiconductor substrate, a tunnel dielectric layer formed on the active region, a floating gate formed on the tunnel dielectric layer, an inter-gate dielectric layer formed on the floating gate, and a control gate electrode formed on the inter-gate dielectric layer.

The flash memory cell may store data while a voltage externally applied to the control gate electrode is being coupled to the floating gate. Thus, in order to store data at a low programming voltage in a short amount of time, a ratio of a voltage induced to the floating gate to the voltage applied to the control gate electrode should be high. The ratio of the voltage induced to the floating gate to the voltage applied to the control gate electrode is termed a "coupling ratio." The coupling ratio may also be expressed as a ratio of the capacitance of the inter-gate dielectric layer to the sum of the capacitances of the tunnel dielectric layer and the inter-gate dielectric layer.

Meanwhile, as the size of electronic systems using flash memory devices is reduced and the demand for low-power consumption components is increased, a flash memory device should be more highly integrated. To achieve higher integration, a gate for the flash memory cell should be scaled down. In recent years, a technique of fabricating the flash memory cell by forming a floating gate and a control gate on a fin-type active region was proposed in order to scale down the gate. An example of this fin-type flash memory cell is disclosed in U.S. Pat. No. 6,657,252 to Fried et al.

FIG. 1 is a perspective view of the fin-type flash memory cell disclosed in U.S. Pat. No. 6,657,252. Referring to FIG. 1, a fin-type active region 100 is provided on a semiconductor substrate 99. An oxide layer pattern 102 is disposed on the fin-type active region 100, and a tunnel dielectric layer 110 is disposed on sidewalls 103 of the fin-type active region 100. Also, the tunnel dielectric layer 110 is covered with a floating gate 115, and the floating gate 115 is covered with an inter-gate dielectric layer 116. A control gate electrode 120 is also disposed on the inter-gate dielectric layer 116 to cross the fin-type active region 100.

The flash memory cell shown in FIG. 1 may improve the integration density of an electronic system, but the inter-gate dielectric layer 116 around the floating gate 115 may adversely affect the coupling ratio. In particular, as compared with a conventional planar gate type flash memory cell, the effective area of the tunnel dielectric layer 110 increases in the flash memory cell including the fin-type active region 100 as shown in FIG. 1, so that the amount of current passing between the floating gate 115 and a channel region may be greatly augmented. However, an increase in the effective area of the tunnel dielectric layer 110 leads to gains in the capacitance of the tunnel dielectric layer 110, but typically causes little variation in the capacitance of the inter-gate dielectric layer 116. As a result, the coupling ratio may be greatly reduced.

SUMMARY OF THE INVENTION

According to an embodiment of the present invention, a flash memory cell includes a fin-type active region disposed at a predetermined region of a semiconductor substrate. Trench regions formed by recessing the semiconductor substrate are disposed on both sides of the fin-type active region. The fin-type active region, which protrudes from the trench regions, has a first sidewall and a second sidewall, which face each other, and a top surface disposed therebetween. Lower portions of the trench regions are filled with trench isolation layers from the surface of the semiconductor substrate to a predetermined height that is less than the height of the fin-type active region. After the lower portions of the trench regions are filled with the trench isolation layers, a floating gate is disposed on the first and second sidewalls and top surface of a portion of the fin-type active region, which is exposed in upper portions of the trench regions. The floating gate has a groove. A control gate electrode fills the groove, covers the floating gate, and crosses over the fin-type active region.

In some of these embodiments, a tunnel dielectric layer may be interposed between the floating gate and the fin-type active region. That is, after the lower portions of the trench regions are filled with the trench isolation layers, the first and second sidewalls and top surface of the exposed portion of the fin-type active region may be covered by the tunnel dielectric layer. In other embodiments, an inter-gate dielectric layer may be interposed between the control gate electrode and the floating gate. The inter-gate dielectric layer may conformally cover inner walls of the groove and the floating gate.

In still other embodiments of the invention, the groove may be disposed over the fin-type active region and have an "I" shape in a lengthwise direction of the fin-type active region. In this case, the floating gate may be split into a first sub floating gate and a second sub floating gate, which are spaced apart from each other by the I-shaped groove. The groove may also have a cross (+) shape. In this case, the floating gate may be split into a first sub floating gate, a second sub floating gate, a third sub floating gate, and a fourth sub floating gate, which are spaced apart from each other by the cross-shaped groove.

Other embodiments of the invention include methods of fabricating a flash memory cell. The methods include forming trench regions by selectively etching predetermined regions of a semiconductor substrate. The trench regions define a fin-type active region that protrudes from the trench regions. Lower portions of the trench regions are filled with trench isolation layers such that an upper portion of the fin-type active region is exposed. A tunnel dielectric layer is formed on sidewalls and a top surface of the exposed portion of the fin-type active region. A floating gate pattern is formed on the surface of the tunnel dielectric layer. The floating gate pattern is selectively removed, thereby forming a groove. An inter-gate dielectric layer is conformally formed on the semiconductor substrate having the groove. A control gate conductive layer is formed to fill the groove and cover the entire surface of the semiconductor substrate. The control gate conductive layer, the inter-gate dielectric layer, and the floating gate pattern are sequentially patterned, thereby forming a control gate electrode and a floating gate. In this case, the control gate electrode crosses over the fin-type active region, and the floating gate is interposed between the control gate electrode and the fin-type active region. Trench oxide layers may also be formed between the etched semiconductor substrate and the trench isolation layers. In addition, upper corners of the fin-type active region may be rounded by an active rounding process.

In still other embodiments of the invention, a mask pattern may be formed on the floating gate pattern. The mask pattern may be formed of a nitride layer. A pullback process may be performed on the mask pattern, thereby forming a mask shrinkage pattern. The pullback process may include isotropically etching the mask pattern to shrink its size. A groove mask oxide layer may be formed on the semiconductor substrate having the mask shrinkage pattern. The groove mask oxide layer may be formed of a material having an etch selectivity with respect to the mask shrinkage pattern. For example, the groove mask oxide layer may be formed of a high-density plasma oxide layer. The groove mask oxide layer may be planarized until the mask shrinkage pattern is exposed. The mask shrinkage pattern may be removed so that a portion of the floating gate pattern may be exposed in the groove mask oxide layer in a lengthwise direction on the fin-type active region. By selectively etching the exposed portion of the floating gate pattern using the groove mask oxide layer as an etch mask, an I-shaped groove may be formed over the fin-type active region in the lengthwise direction of the fin-type active region. The selective etching of the exposed portion of the floating gate pattern may be performed until the tunnel dielectric layer is exposed or a portion of the floating gate pattern remains on the tunnel dielectric layer. When the floating gate is selectively etched until the tunnel dielectric layer is exposed, the floating gate may be split into a first sub floating gate and a second sub floating gate. The I-shaped groove may be formed to have a width smaller than the patterning limit of a photolithography.

In still other embodiments of the invention, the groove mask oxide layer may be patterned such that a portion of the floating gate pattern is exposed in a direction crossing the fin-type active region. The floating gate pattern having the I-shaped groove may be selectively etched, thereby forming a cross-shaped groove. The selective etching of the floating gate pattern having the I-shaped groove may be performed until the tunnel dielectric layer is exposed or such that a portion of the floating gate pattern remains on the tunnel dielectric layer. When the floating gate pattern having the I-shaped groove is selectively etched until the tunnel dielectric layer is exposed, the floating gate may be split into a first sub floating gate, a second sub floating gate, a third sub floating gate, and a fourth sub floating gate.

The inter-gate dielectric layer may also be formed by sequentially stacking an oxide layer, a nitride layer, and an oxide layer so that the inter-gate dielectric layer is an oxide-nitride-oxide (OXO) layer.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION OF PREFERRED EMBODIMENTS

Figure 1:
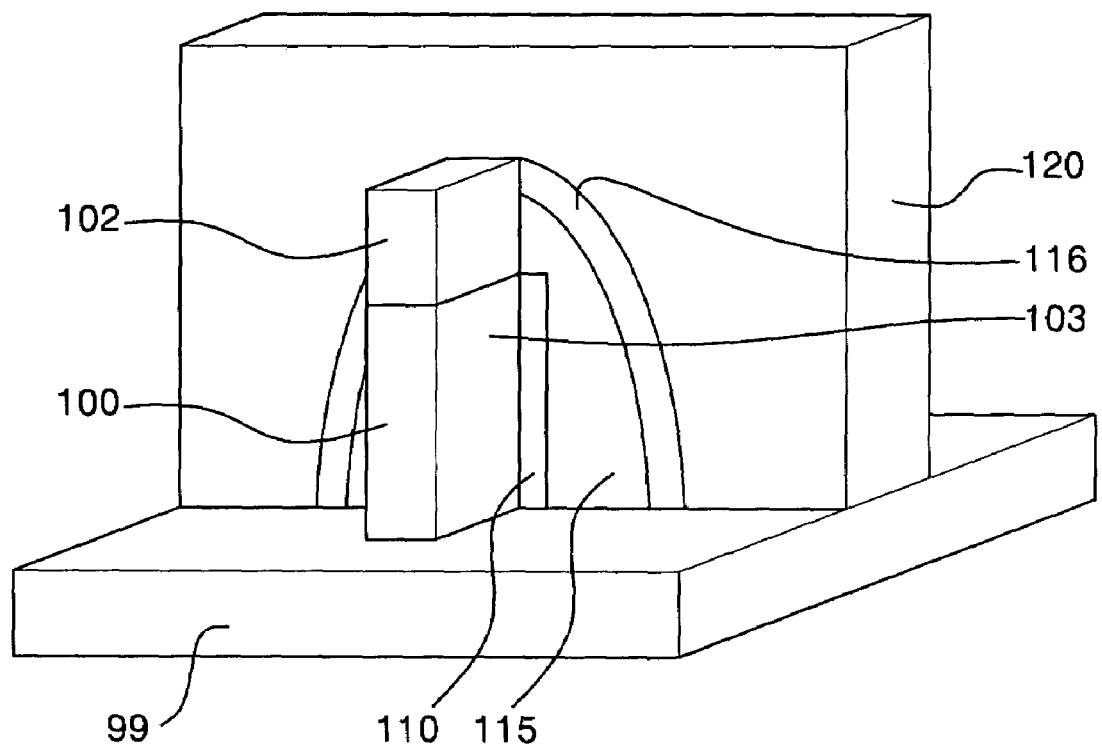
FIG. 1 is a perspective view of a conventional flash memory cell.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. In the drawings, the thickness of layers and regions are exaggerated for clarity. The same reference numerals are used to denote the same elements.

Figure 2:
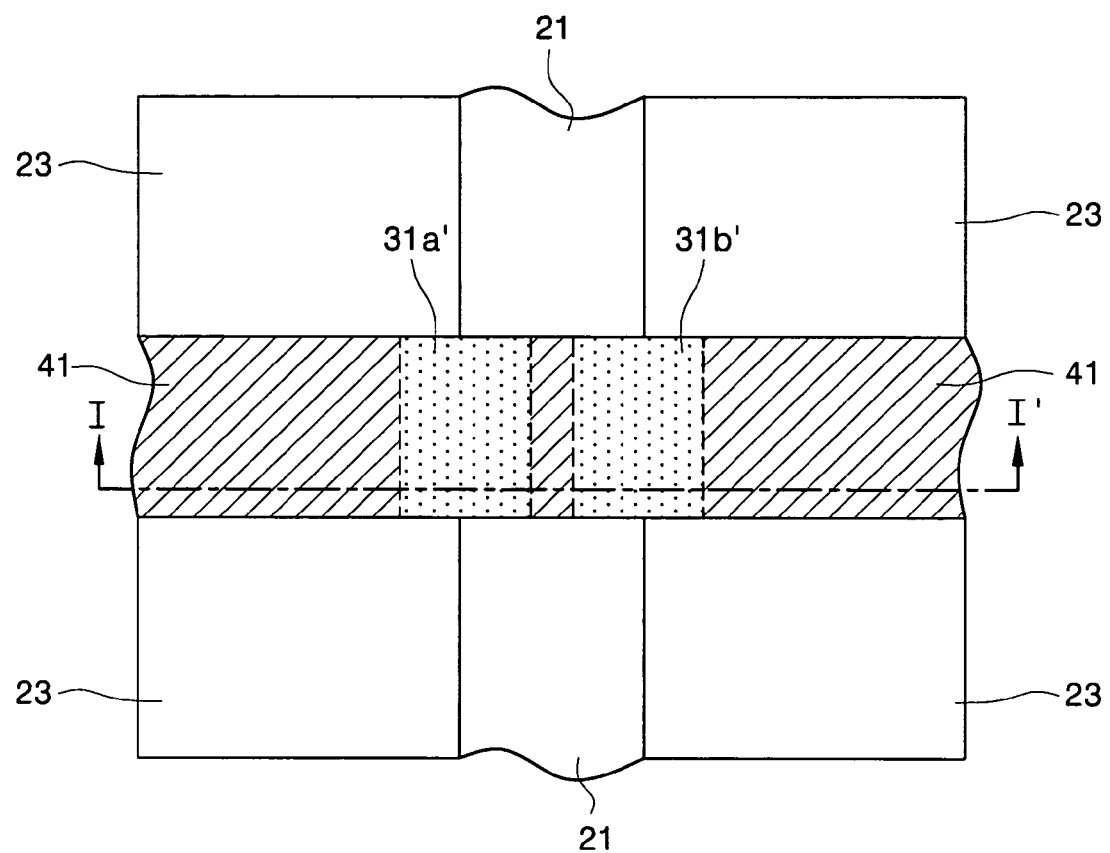
FIG. 2 is a plan view of a portion of a flash memory cell according to an exemplary embodiment of the present invention.
Figure 3:
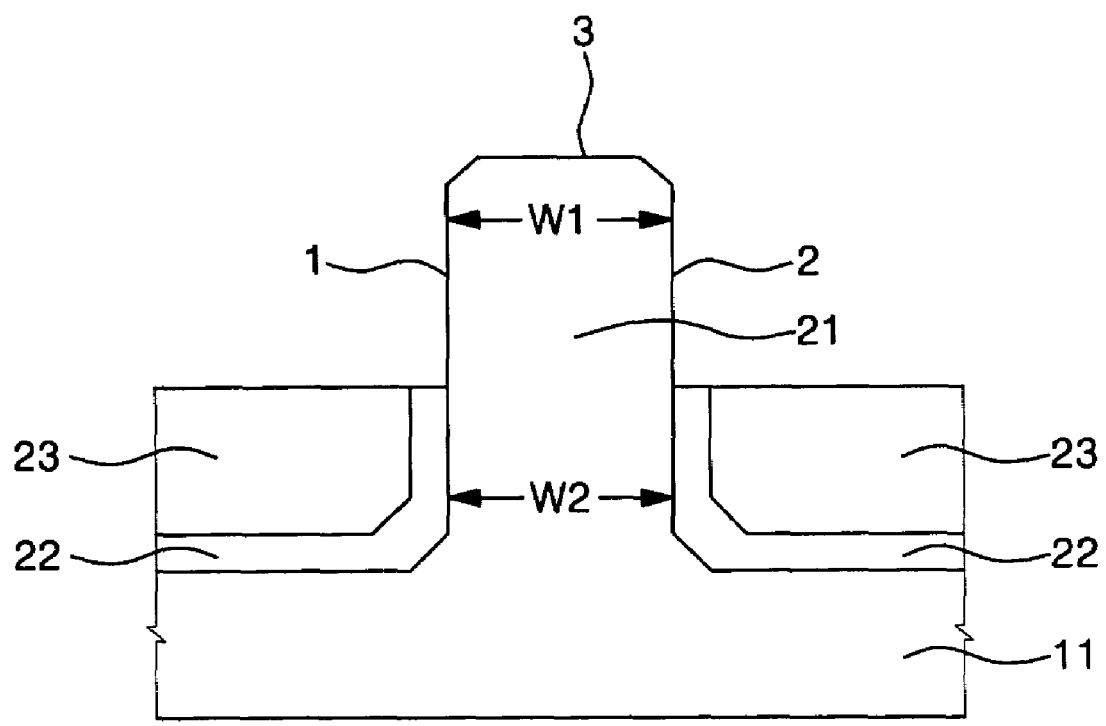
FIGS. 3, 5, 6, 7, 8, 9, and 11 are cross-sectional views taken along line I-I' of FIG. 2, which illustrate respective process operations.
Figure 4:
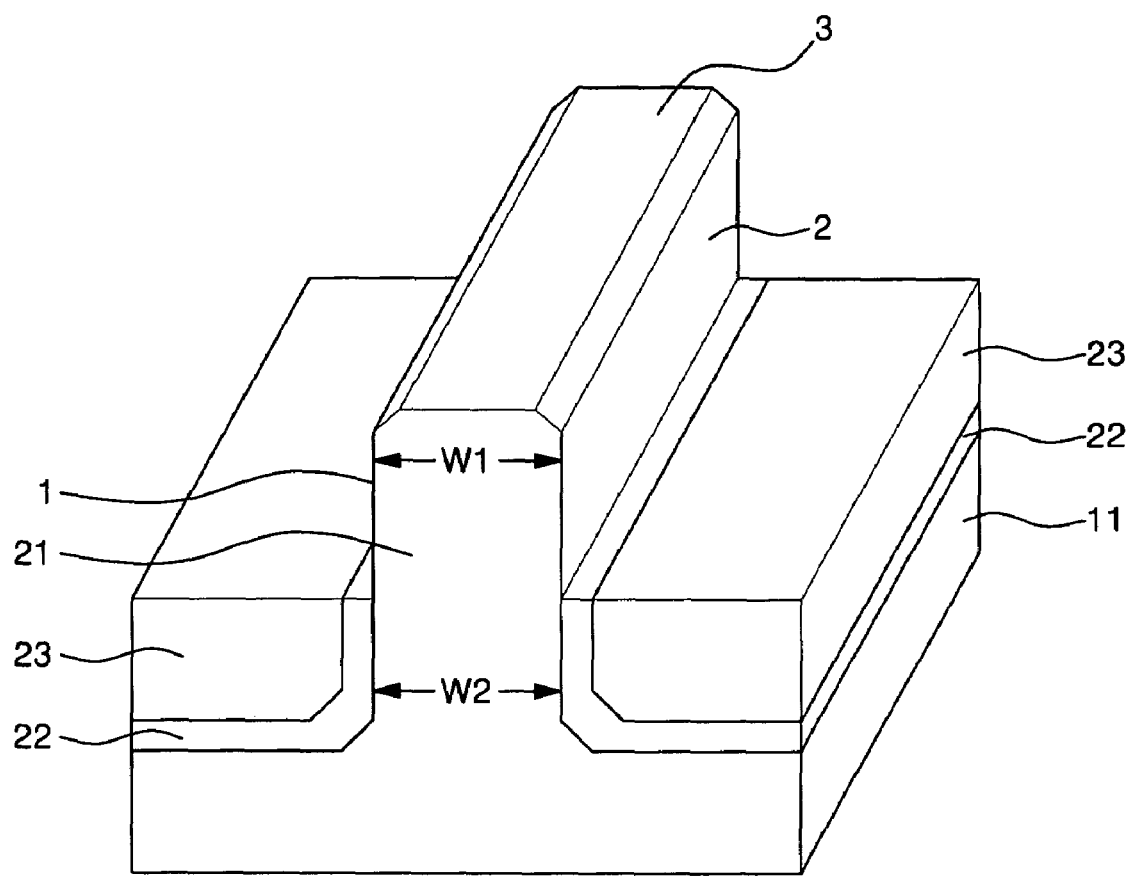
FIGS. 4, 10, and 12 are perspective views that correspond to FIGS. 3, 9, and 11, respectively.
Figure 8:
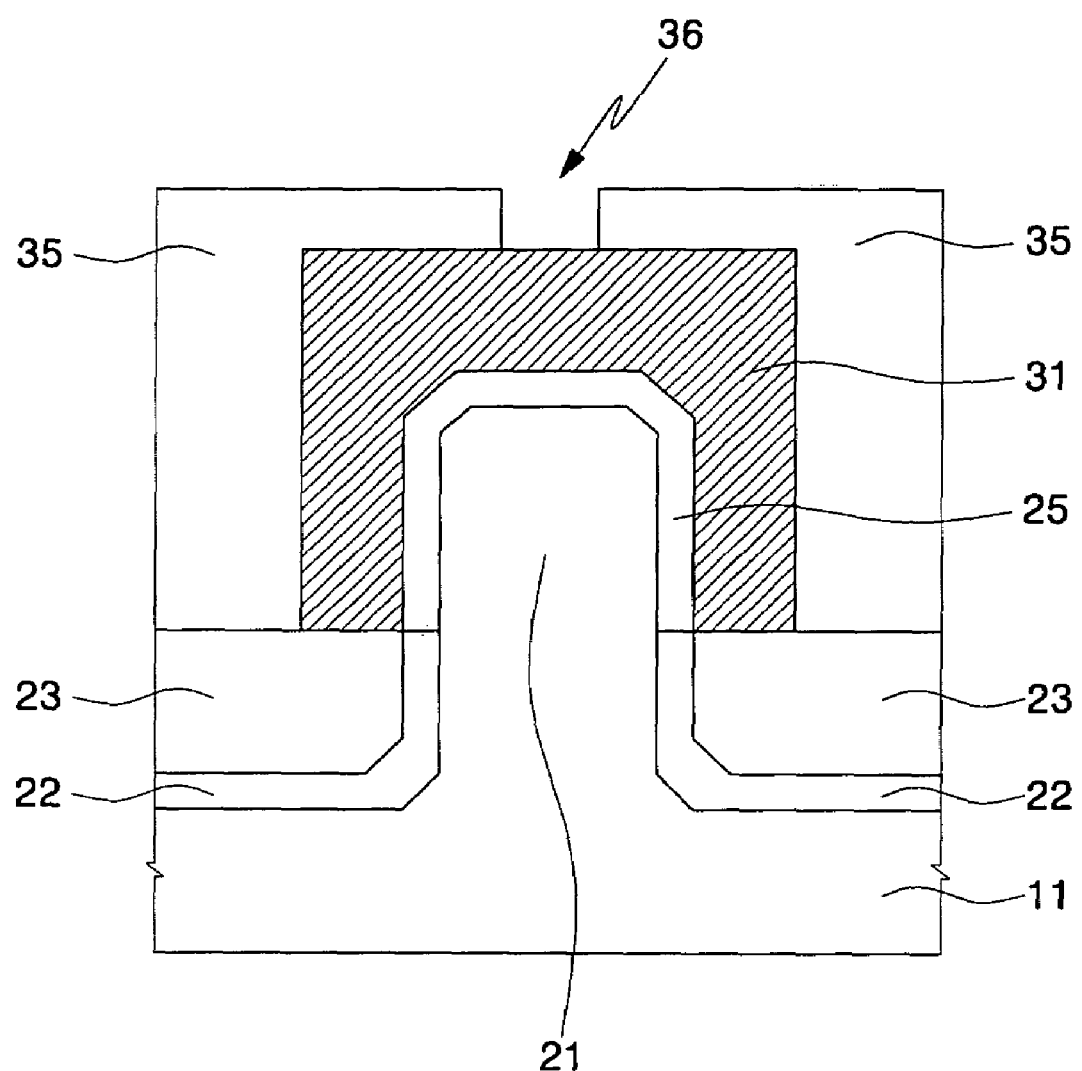
Figure 9:
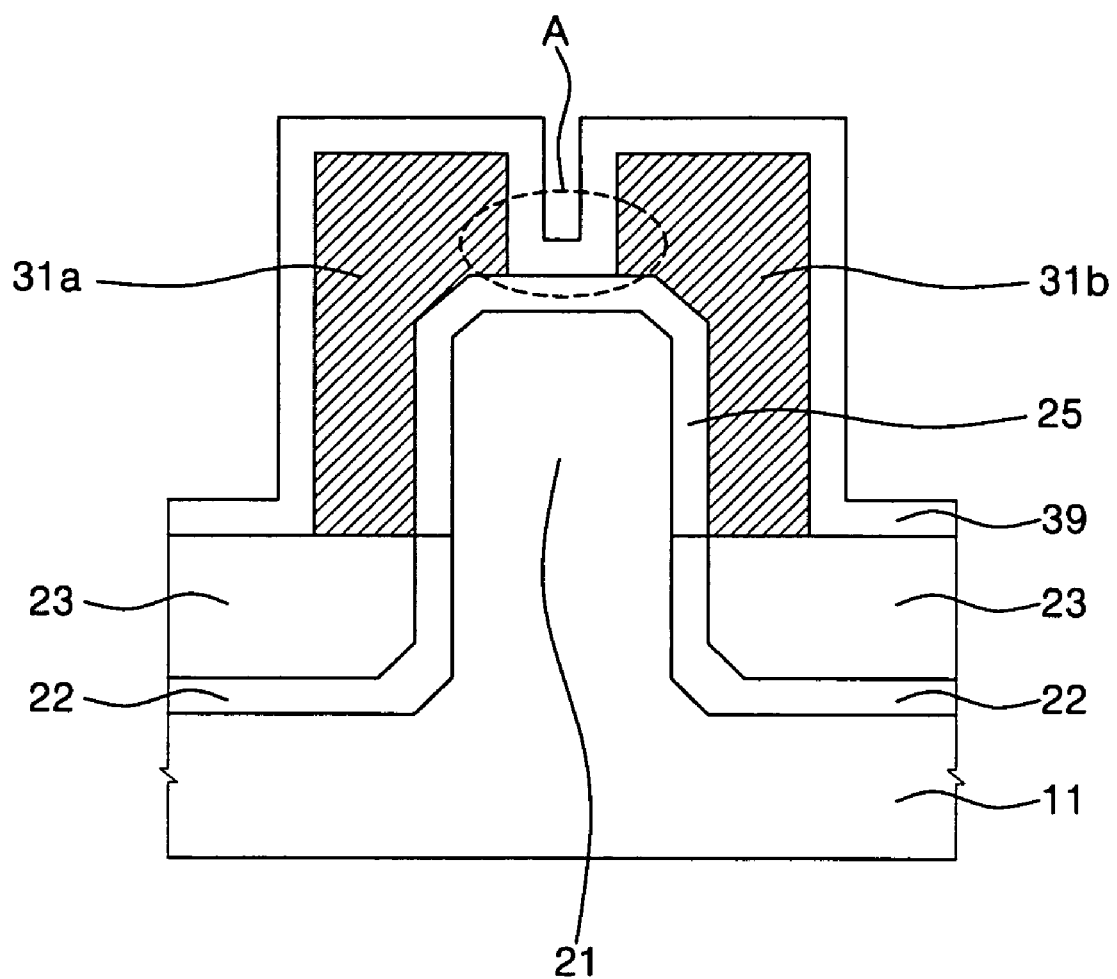
Figure 10:
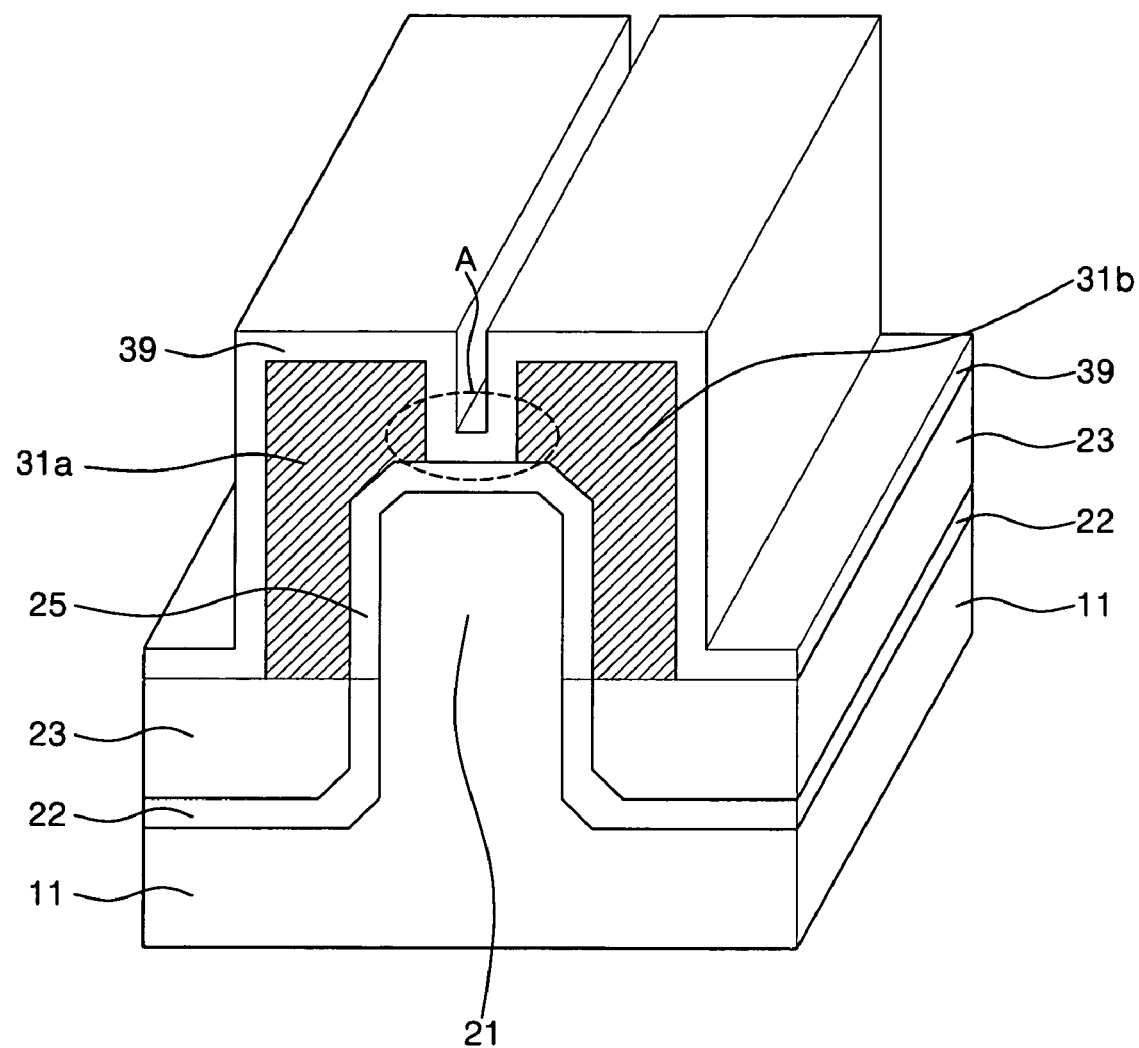
Figure 11:
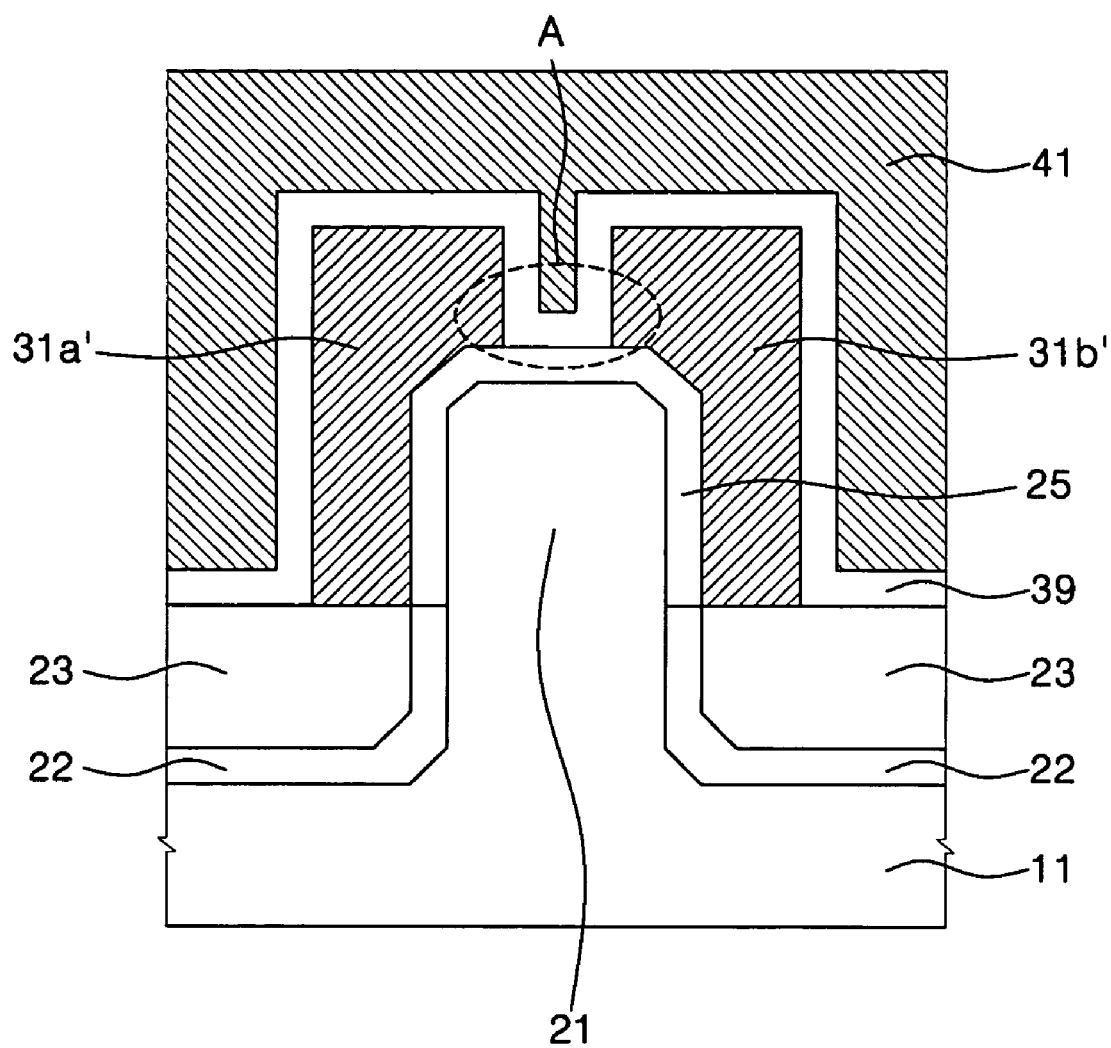
Figure 12:
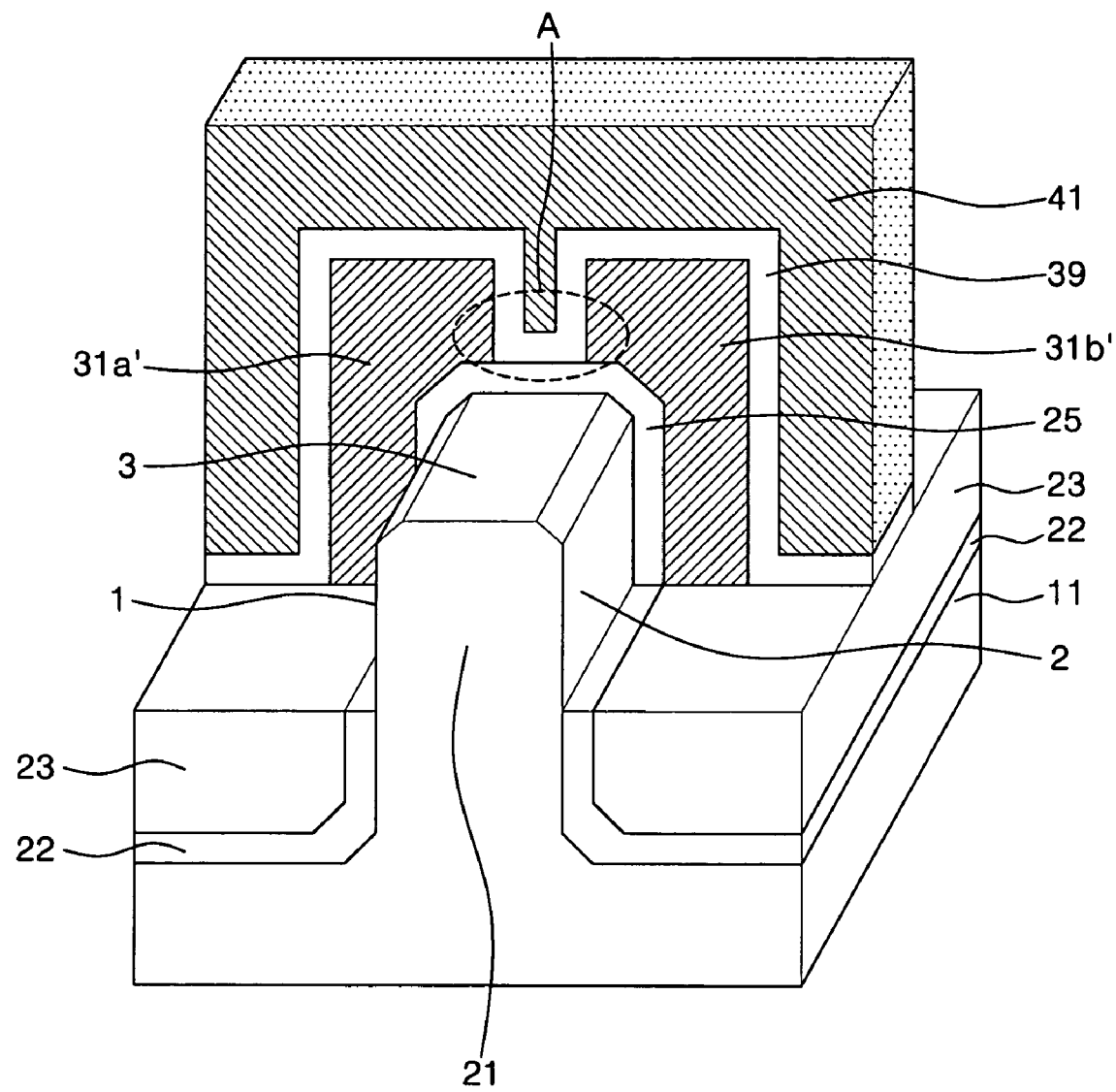

FIGS. 2 through 12 include a plan view, cross-sectional views, and perspective views illustrating a flash memory cell having a floating gate and method of fabricating the same according to an exemplary embodiment of the present invention. Specifically, FIG. 2 is a plan view of a portion of the flash memory cell, FIGS. 3, 5, 6, 7, 8, 9, and 11 are cross-sectional views taken along line I-I' of FIG. 2, which illustrate respective process operations, and FIGS. 4, 10, and 12 are perspective views that correspond to FIGS. 3, 9, and 11, respectively.

Referring to FIGS. 2, 3, and 4, the method of fabricating the flash memory cell according to an exemplary embodiment of the present invention includes forming trench regions that define a fin-type active region 21 by selectively etching predetermined regions of a semiconductor substrate 11. The fin-type active region 21, which protrudes from the trench regions, has a first sidewall 1 and a second sidewall 2, which face each other, and a top surface 3 disposed therebetween. The fin-type active region 21 may be formed in a trapezoid shape having a smaller upper width W1 than a lower width W2. However, it is assumed herein that the upper and lower widths W1 and W2 of the fin-type active region 21 are identical, for clarity of drawings and explanation. Also, upper corners of the fin-type active region 21 may be rounded using an active rounding process. The active rounding process may be performed using a thermal oxidation process or a wet cleaning process.

Trench oxide layers 22 and trench isolation layers 23 are formed in lower portions of the trench regions. The trench oxide layers 22 may be used to cure damage caused by the etching of the semiconductor substrate 11 during the formation of the trench regions and may be formed using a thermal oxidation process. Also, in order to form the trench isolation layers 23, the trench regions are filled with a high-density plasma oxide layer having a good gap filling characteristic, and then the high-density plasma oxide layer is selectively etched to a predetermined thickness, which is less than the height of the fin-type active region 21. Thus, the first and second sidewalls 1 and 2 and top surface 3 of the fin-type active region 21 protrude from the surfaces of the trench isolation layers 23. Thereafter, the trench oxide layers 22 that remain on the first and second sidewalls 1 and 2 are removed using etching and cleaning processes. As a result, the first and second sidewalls 1 and 2 and the top surface 3 in an upper portion of the fin-type active region 21 are exposed.

Figure 5:
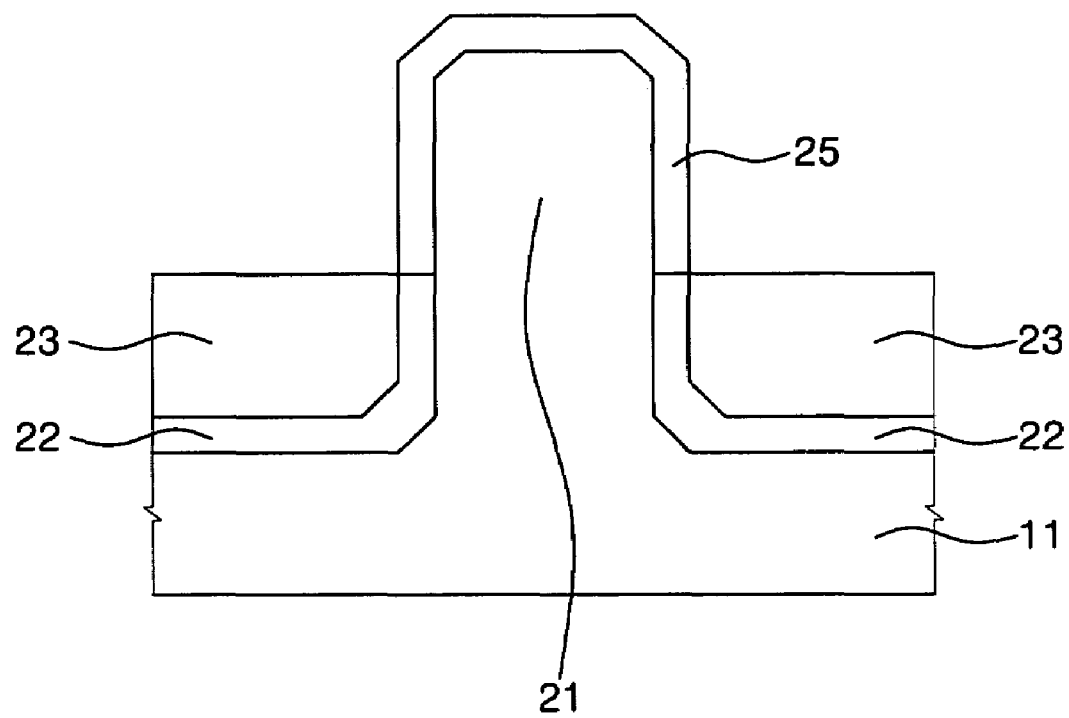

Referring to FIGS. 2 and 5, a tunnel dielectric layer 25 is formed on the exposed sidewalls 1 and 2 and top surface 3 of the fin-type active region 21. The tunnel dielectric layer 25 may be formed of a silicon oxide layer using a thermal oxidation process. In other embodiments, the tunnel dielectric layer 25 may be formed of a silicon oxide layer or a high-k dielectric layer using an atomic layer deposition (ALD) process other dielectric materials may also be used to form the tunnel dielectric layers.

Figure 6:
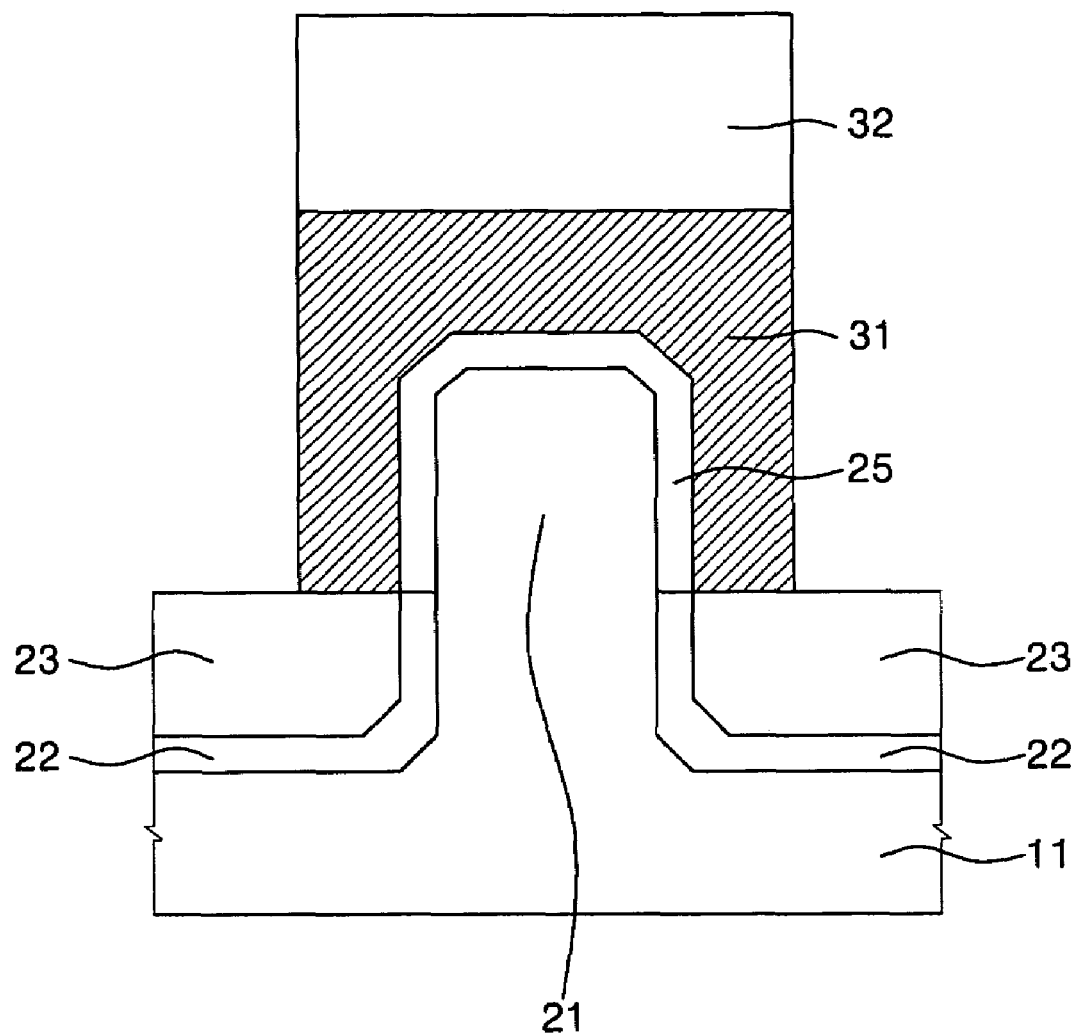

Referring to FIGS. 2 and 6, a floating gate conductive layer (not shown), such as a polysilicon layer, is deposited on the semiconductor substrate 11 having the tunnel dielectric layer 25. Preferably, the top surface of the floating gate conductive layer is planarized. The planarization of the floating gate conductive layer may be performed using an etchback process or a chemical mechanical polishing (CMP) process. A mask layer (not shown) is deposited on the planarized floating gate conductive layer. The mask layer may be formed of a nitride layer (e.g., a silicon nitride layer) using a chemical vapor deposition (CVD) process. After that, the mask layer and the floating gate conductive layer are patterned to form a mask pattern 32 and a floating gate pattern 31. In this case, the floating gate pattern 31 covers the both sidewalls 1 and 2 and top surface 3 of the fin-type active region 21, but is electrically insulated by the tunnel dielectric layer 25.

Figure 7:
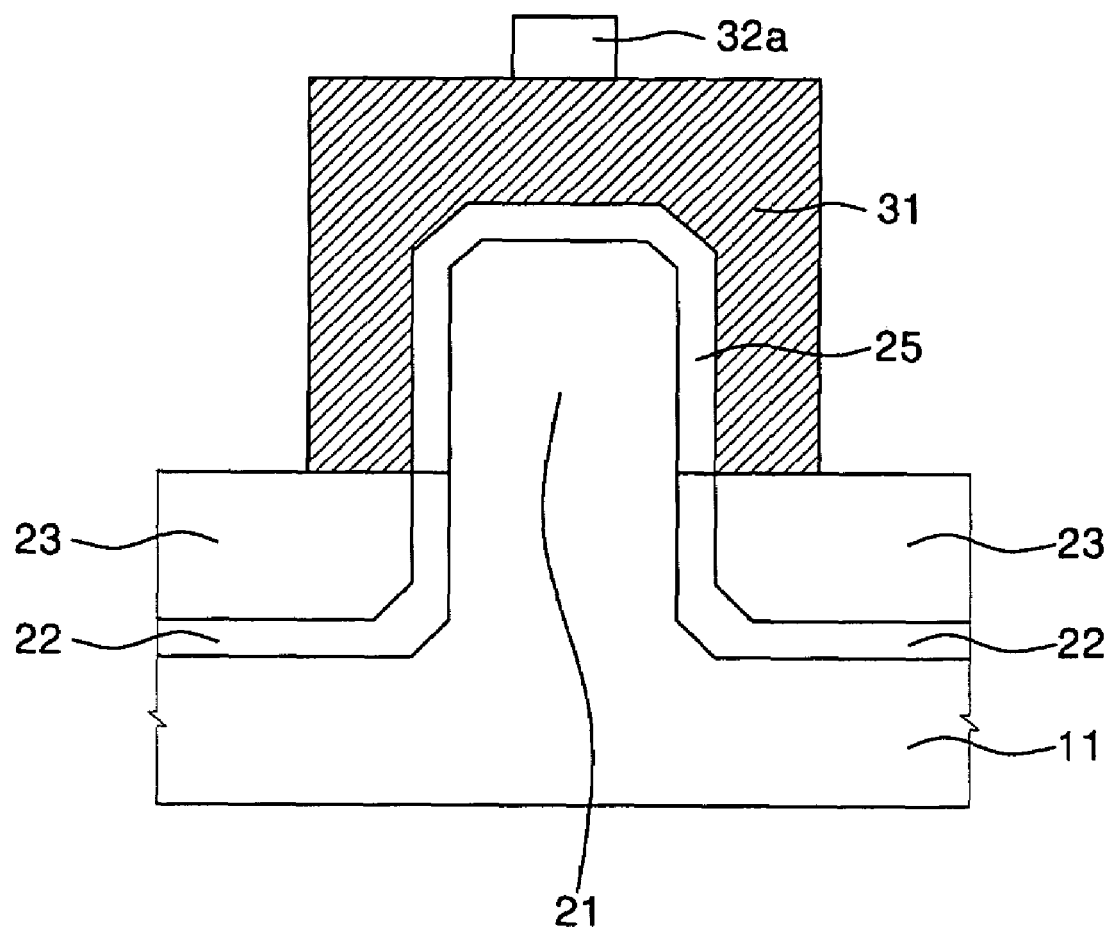

Referring to FIGS. 2 and 7, a pullback process is performed on the mask pattern 32, thereby forming a mask shrinkage pattern 32a. Specifically, the mask pattern 32 disposed on the floating gate pattern 31 is isotropically etched. Thus, all the exposed surfaces of the mask pattern 32 are etched to shrink its thickness and width. As a result, the mask shrinkage pattern 32a is formed on the center of the floating gate pattern 31 in a lengthwise direction of the fin-type active region 21. Also, the mask shrinkage pattern 32a may be formed to have a width smaller than the patterning limit of a photolithography process.

Referring to FIGS. 2 and 8, a groove mask oxide layer 35 is formed on the semiconductor substrate 11 having the mask shrinkage pattern 32a. The groove mask oxide layer 35 may be formed of a material having an etch selectivity with respect to the mask shrinkage pattern 32a. When the mask shrinkage pattern 32a is a nitride layer, the groove mask oxide layer 35 may be formed of a silicon oxide layer, such as a high-density plasma oxide layer. The groove mask oxide layer 35 is planarized to expose the top surface of the mask shrinkage pattern 32a. The planarization of the groove mask oxide layer 35 may be performed by a CMP process using the mask shrinkage pattern 32a as a stop layer. Thereafter, the mask shrinkage pattern 32a is removed. For example, when the mask shrinkage pattern 32a is a silicon nitride layer, it may be easily removed using a phosphoric acid solution. As a result, an opening 36 is formed in the groove mask oxide layer 35 to expose a portion of the floating gate pattern 31. The opening 36 may be formed in the lengthwise direction of the fin-type active region 21. Also, the opening 36 may be formed to have a width smaller than the patterning limit of a photolithography process.

Referring to FIGS. 2, 9, and 10, the exposed portion of the floating gate pattern 31 is selectively etched using the groove mask oxide layer 35 as an etch mask, thereby forming a groove A. The groove A may be formed in the top surface of the floating gate pattern 31 in the lengthwise direction of the fin-type active region 21. That is, the groove A may have an "I" shape. In this case, the I-shaped groove A may be formed to such a depth that the floating gate pattern 31 is completely recessed and the tunnel dielectric layer 25 is exposed. Alternatively, the I-shaped groove A may be formed to such a depth that a portion of the floating gate pattern 31 remains on the tunnel dielectric layer 25. Further, the I-shaped groove A may be formed to have a width smaller than the patterning limit of a photolithography process. When the I-shaped groove A has the greatest depth, the floating gate pattern 31 may be split into a first sub floating gate pattern 31a and a second sub floating gate pattern 31b, which are spaced apart from each other. Here, as the depth of the I-shaped groove A becomes greater, a coupling ratio becomes higher. Thereafter, the groove mask oxide layer 35 used as the etch mask is removed. Then, an inter-gate dielectric layer 39 is conformally formed on the semiconductor substrate 11 having the first and second sub floating gate patterns 31a and 31b. That is, the inter-gate dielectric layer 39 may conformally cover the inner walls of the groove A and also cover the first and second sub floating gate patterns 31a and 31b. The inter-gate dielectric layer 39 may be formed by sequentially stacking an oxide layer, a nitride layer, and an oxide layer (ONO). In this case, at least a portion of the inter-gate dielectric layer 39 may be in contact with the tunnel dielectric layer 25.

Referring to FIGS. 2, 11, and 12, a control gate conductive layer (not shown) is deposited on the entire surface of the semiconductor substrate 11 having the inter-gate dielectric layer 39. The control gate conductive layer may be formed to completely fill the groove A and cover the entire surface of the semiconductor substrate 11. The control gate conductive layer may be formed of polysilicon. Subsequently, the control gate conductive layer is patterned to form a control gate electrode 41, which fills the groove A and crosses over the fin-type active region 21. The control gate electrode 41 is electrically insulated from the first and second sub floating gate patterns 31a and 31b by the inter-gate dielectric layer 39.

While the control gate electrode 41 is being formed, the inter-gate dielectric layer 39 and the first and second sub floating gate patterns 31a and 31b are sequentially etched, thereby forming a floating gate 31a' and 31b' as shown in FIG. 12. When the groove A has the greatest depth, it may split the floating gate 31a' and 31b' into a first sub floating gate 31a' and a second sub floating gate 31b'. Thereafter, typical processes, such as an ion implantation process and formation of source and drain, are performed on portions of the fin-type active region 21, so that a flash memory cell may be completed.

Hereinafter, the structure of the above-described flash memory cell having the floating gate 31a' and 31b' will be described with reference to FIGS. 2 and 12. Referring to FIGS. 2 and 12, a fin-type active region 21 is provided at a predetermined region of a semiconductor substrate 11. To reduce the electric field crowding, each of upper corners of the fin-type active regions 21 may have a round shape. Trench regions, which are formed by recessing the semiconductor substrate 11, are disposed on both sides of the fin-type active region 21. The fin-type active region 21, which protrudes from the trench regions, has a first sidewall 1, a second sidewall 2, and a top surface 3 disposed therebetween. Lower portions of the trench regions are filled with trench isolation layers 23 from the surface of the semiconductor substrate 11 to a predetermined height that is less than the height of the fin-type active region 21. Trench oxide layers 22 may be interposed between the trench isolation layers 23 and the semiconductor substrate 11. After the lower portions of the trench regions are filled with the trench isolation layers 23, the first and second sidewalls 1 and 2 and top surface 3 of the fin-type active region 21, which are exposed in upper portions of the trench regions, are covered by a tunnel dielectric layer 25. A floating gate 31a' and 31b' covers the first and second sidewalls 1 and 2 and top surface 3 of the fin-type active region 21, which are covered by the tunnel dielectric layer 25. The floating gate 31a' and 31b' has an I-shaped groove A, which is disposed over the top surface 3 in a lengthwise direction of the fin-type active region 21. A control gate electrode 41 completely fills the groove A, covers the floating gate 31a' and 31b', and crosses over the fin-type active region 21. An inter-gate dielectric layer 39 is interposed between the control gate electrode 41 and the floating gate 31a' and 31b'.

The I-shaped groove A may be formed to such a depth that the top surface of the tunnel dielectric layer 25 is exposed. When the I-shaped groove A has the greatest depth, the floating gate 31a' and 31b' may be split into a first sub floating gate 31a' and a second sub floating gate 31b' by the groove A. In this case, the effective area of the inter-gate dielectric layer 39 interposed between the control gate electrode 41 and the floating gate 31a' and 31b' is increased due to the groove A. On the other hand, the effective area of the tunnel dielectric layer 25 interposed between the fin-type active region 21 and the floating gate 31a' and 31b' is reduced due to the groove A. In this case, the amount of current in the fin-type active region 21 may be held constant through the influence of the control gate electrode 41 filled in the groove A. As a result, a coupling ratio, which is expressed as a ratio of the capacitance of the inter-gate dielectric layer 39 to the sum of the capacitances of the tunnel dielectric layer 25 and the inter-gate dielectric layer 39, may be greatly elevated.

Figure 13:
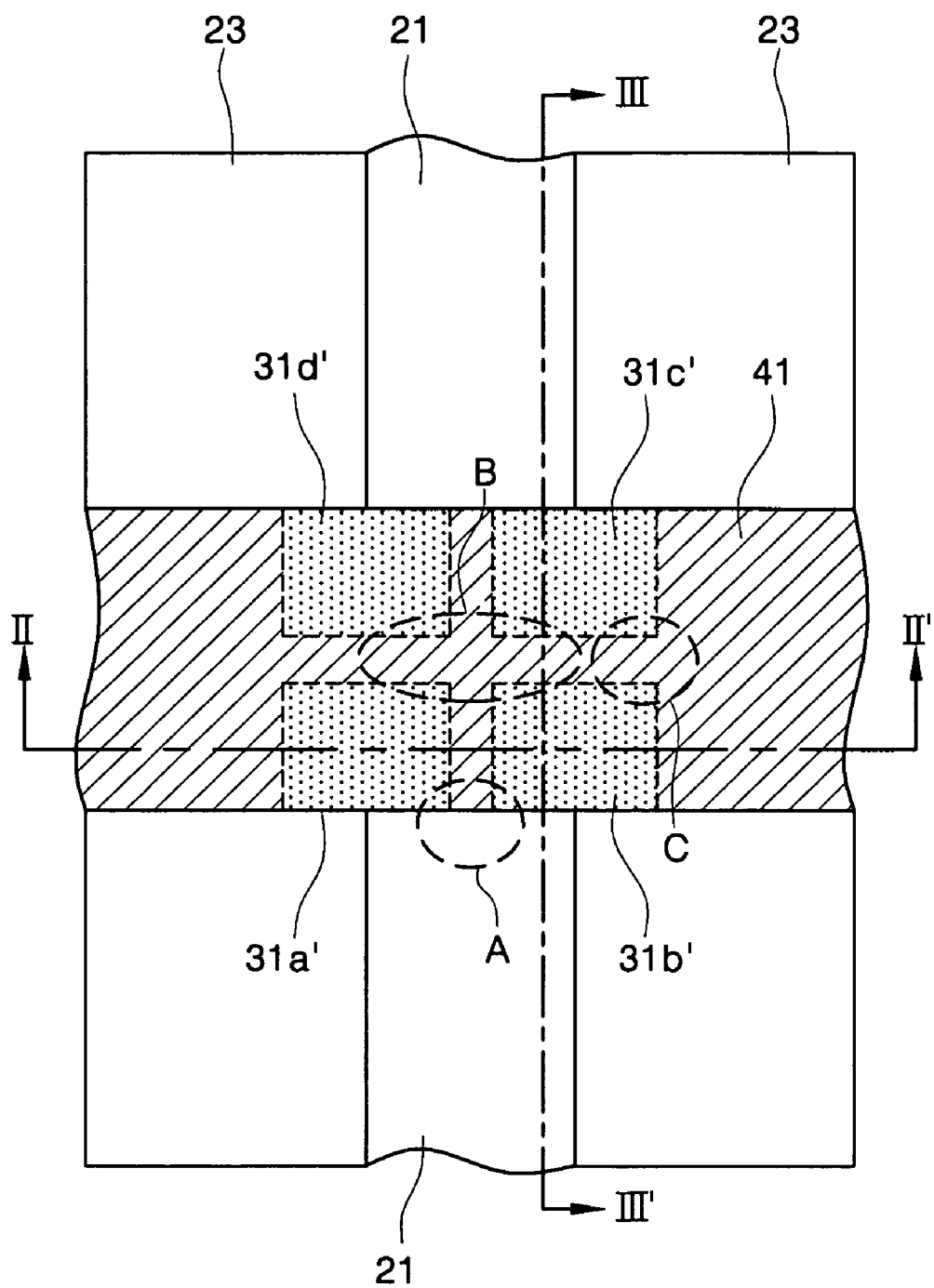
FIG. 13 is a plan view of a portion of a flash memory cell according to another exemplary embodiment of the present invention.
Figure 23:
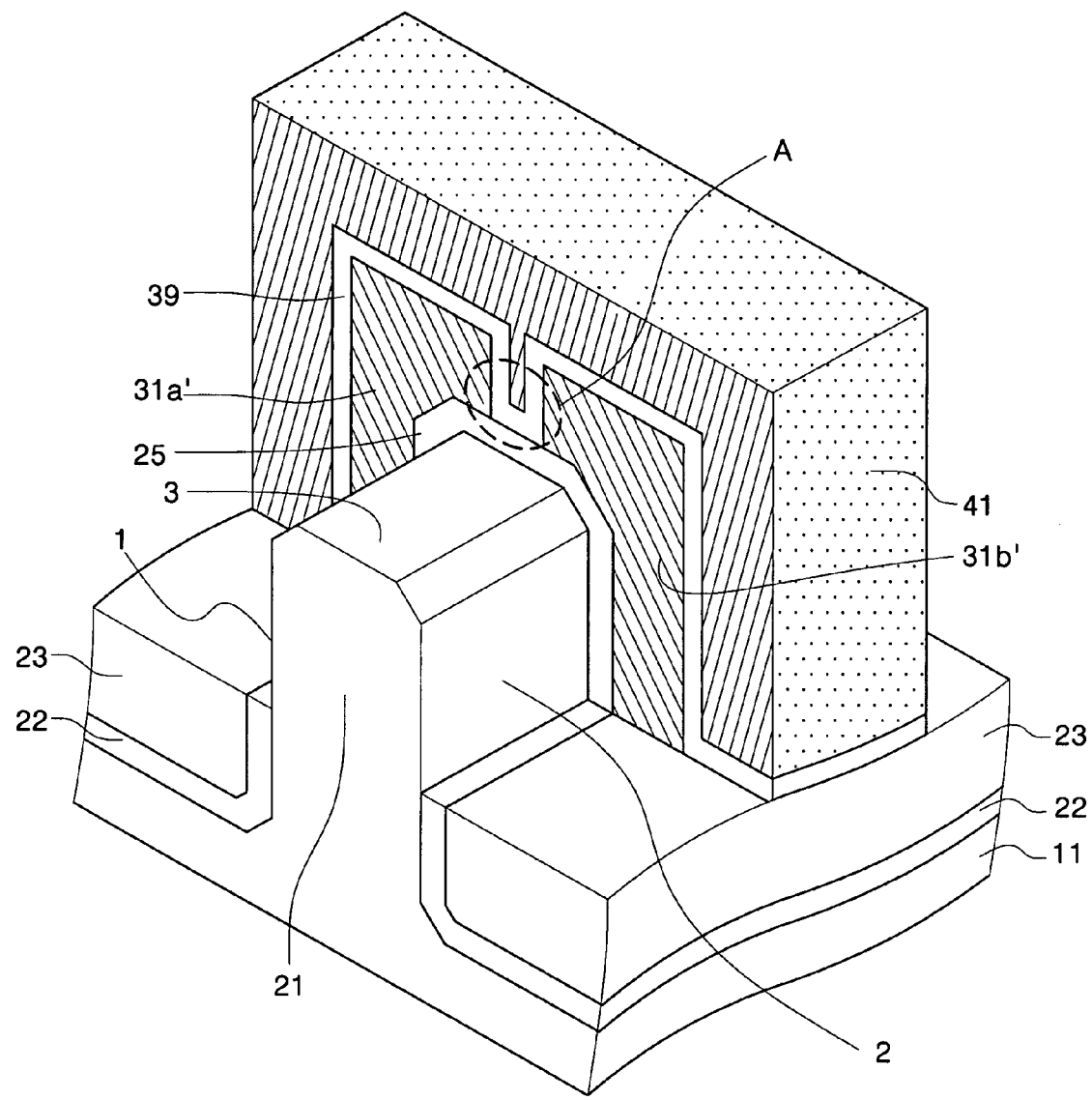
Figure 24:
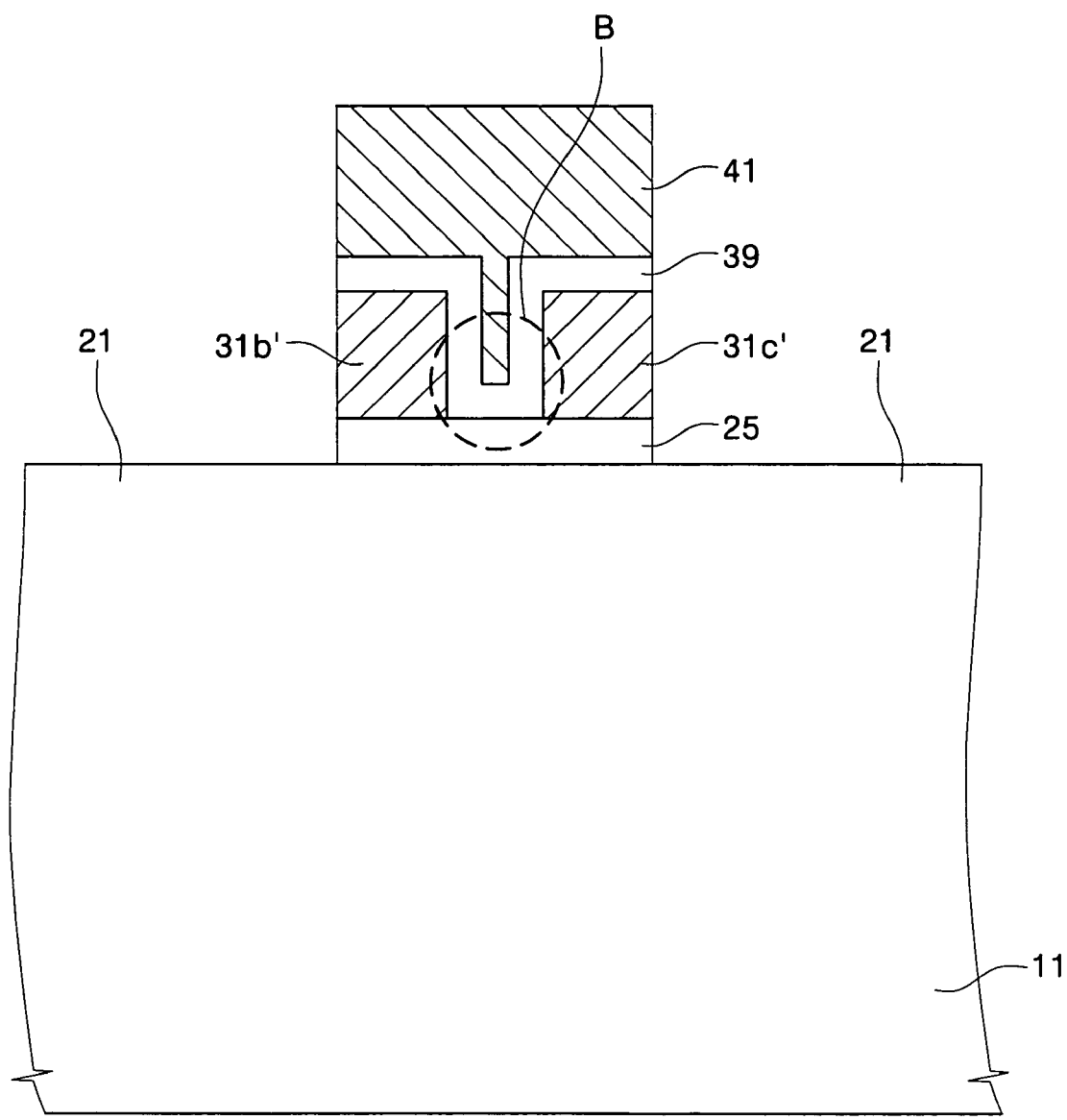
FIG. 24 is a cross-sectional view taken along line III-III' of FIG. 13.

FIGS. 13 through 24 include a plan view, cross-sectional views, and perspective views illustrating a flash memory cell having a floating gate and method of fabricating the same according to another exemplary embodiment of the present invention. Specifically, FIG. 13 is a plan view of a portion of the flash memory cell, FIGS. 14, 16, 18, 20, and 22 are cross-sectional views taken along line II-II' of FIG. 13, which illustrate respective process operations, FIGS. 15, 17, 19, 21, and 23 are perspective views that correspond to FIGS. 14, 16, 18, 20, and 22, respectively, and FIG. 24 is a cross-sectional view taken along line III-III' of FIG. 13.

Because the method of fabricating the flash memory cell according to another exemplary embodiment of the present invention is the same as those of the previous embodiment described with reference to FIGS. 3 through 8, only the differences will be described in detail.

Figure 14:
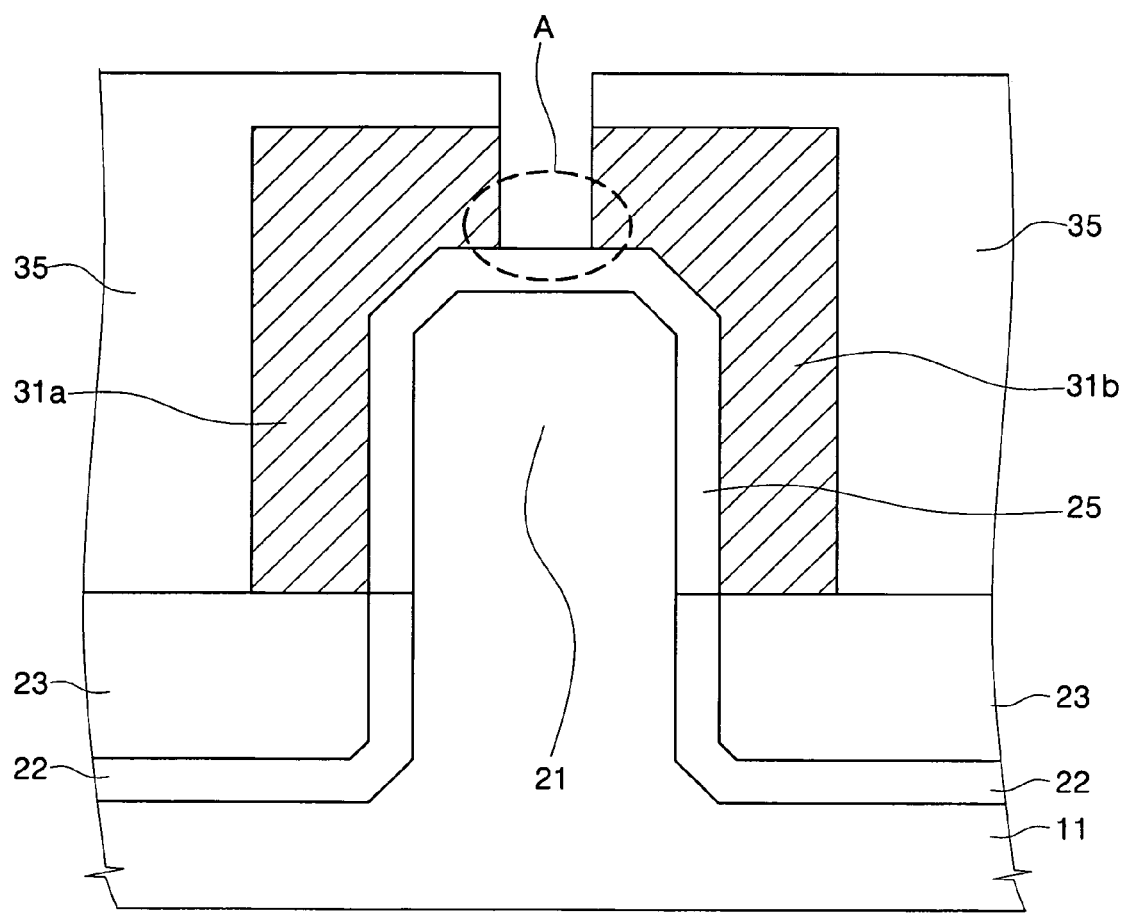
FIGS. 14, 16, 18, 20, and 22 are cross-sectional views taken along line II-II' of FIG. 13, which illustrate respective process operations.
Figure 15:
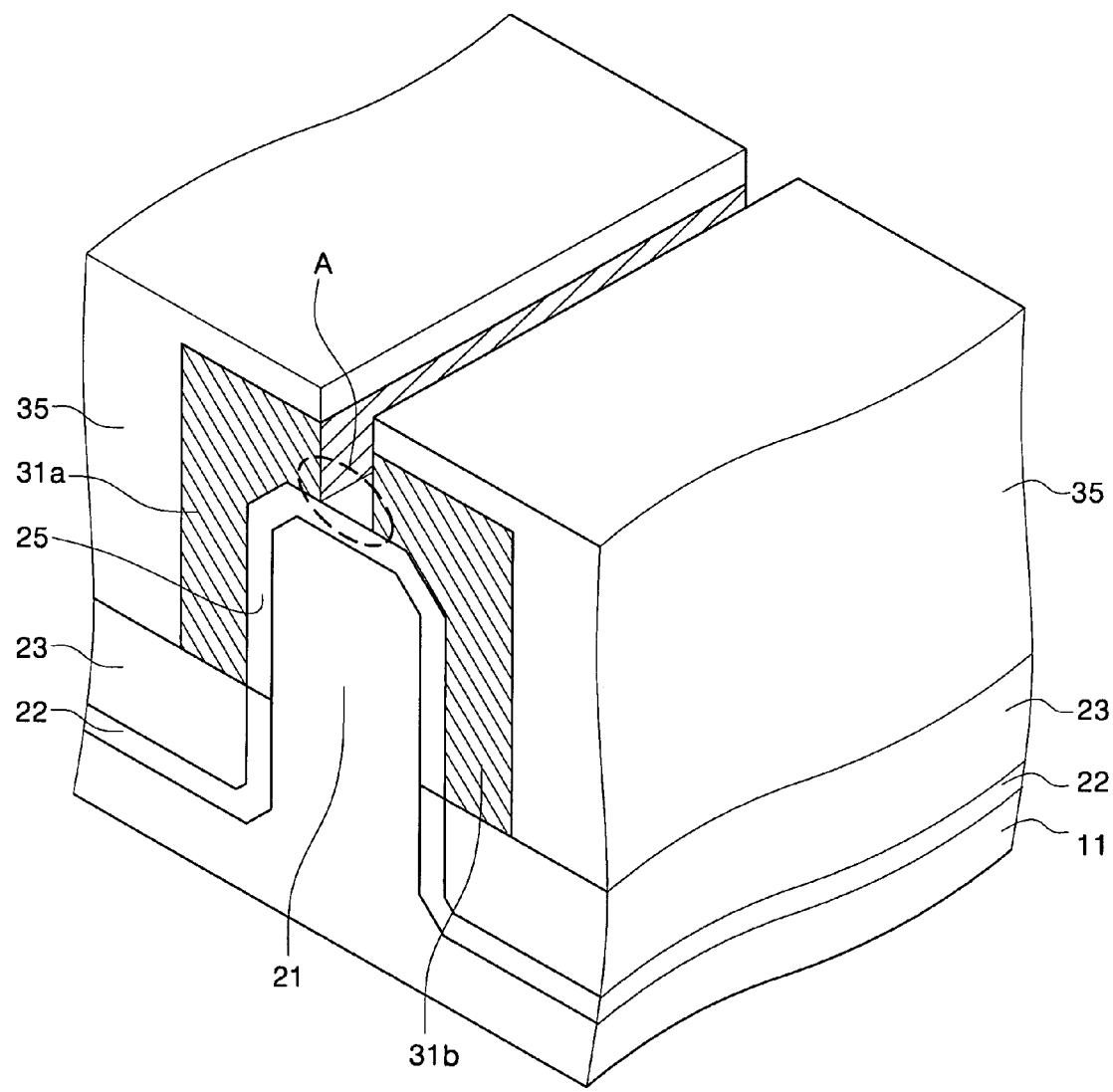
FIGS. 15, 17, 19, 21, and 23 are perspective views that correspond to FIGS. 14, 16, 18, 20, and 22, respectively.

Referring to FIGS. 13, 14, and 15, the method of fabricating the flash memory according to another exemplary embodiment of the present invention includes forming an I-shaped groove A by selectively etching a floating gate pattern 31 using a groove mask oxide layer 35 as an etch mask. The I-shaped groove A may be formed to such a depth that the floating gate pattern 31 is completely recessed and a tunnel dielectric layer 25 is exposed. Alternatively, the I-shaped groove A may be formed to such a depth that a portion of the floating gate pattern 31 remains on the tunnel dielectric layer 25. Further, the I-shaped groove A may be formed to have a width smaller than the patterning limit of a photolithography process. When the I-shaped groove A has the greatest depth, the floating gate pattern 31 may be split into a first sub floating gate pattern 31a and a second sub floating gate pattern 31b, which are spaced apart from each other.

Figure 16:
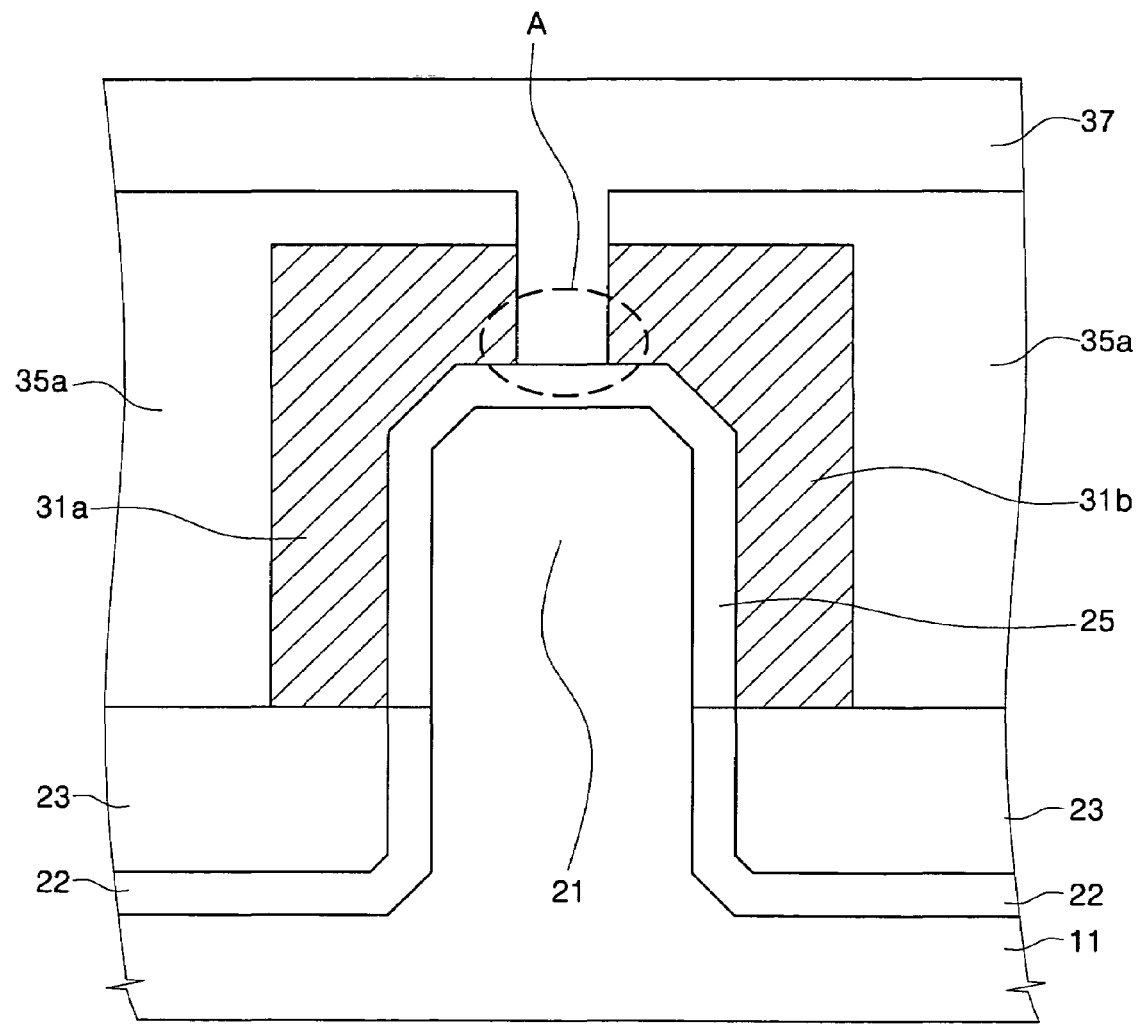
Figure 17:
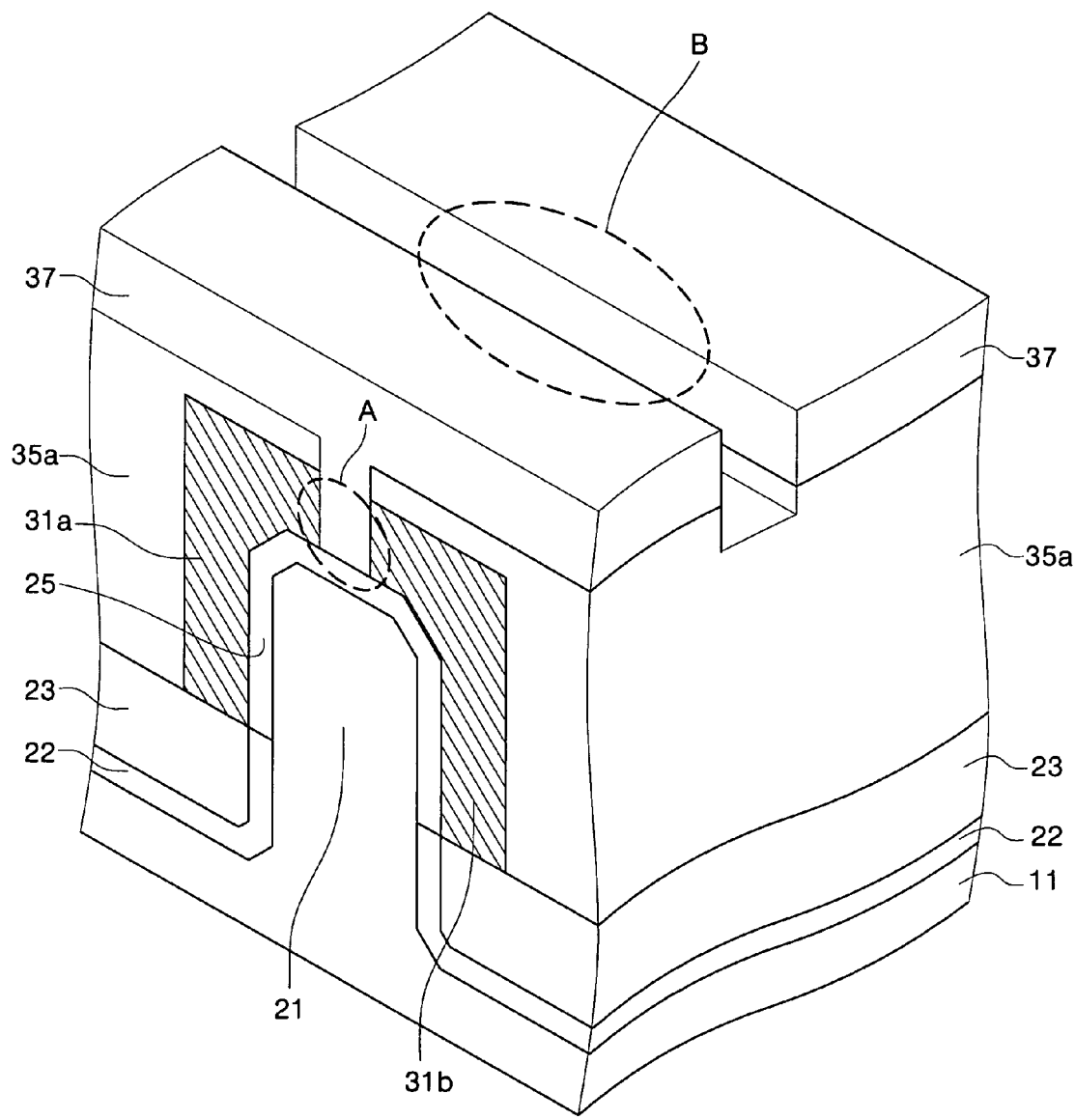

Referring to FIGS. 13, 16, and 17, a photoresist pattern 37 is formed on the groove mask oxide layer 35. An anti-reflective coating (ARC) layer (not shown) may be additionally formed between the photoresist pattern 37 and the groove mask oxide layer 35. Since the ARC layer serves to reduce the diffuse reflection of light exposed during the formation of the photoresist pattern, the photoresist pattern may be formed in a fine pattern. However, the ARC layer may be omitted. The groove mask oxide layer 35 is etched using the photoresist pattern 37 as an etch mask, thereby forming an opening B. In the groove mask oxide layer 35 having the opening B, the top surfaces of the first and second sub floating gate patterns 31a and 31b may be partially exposed in a direction crossing the fin-type active regions 21.

Figure 18:
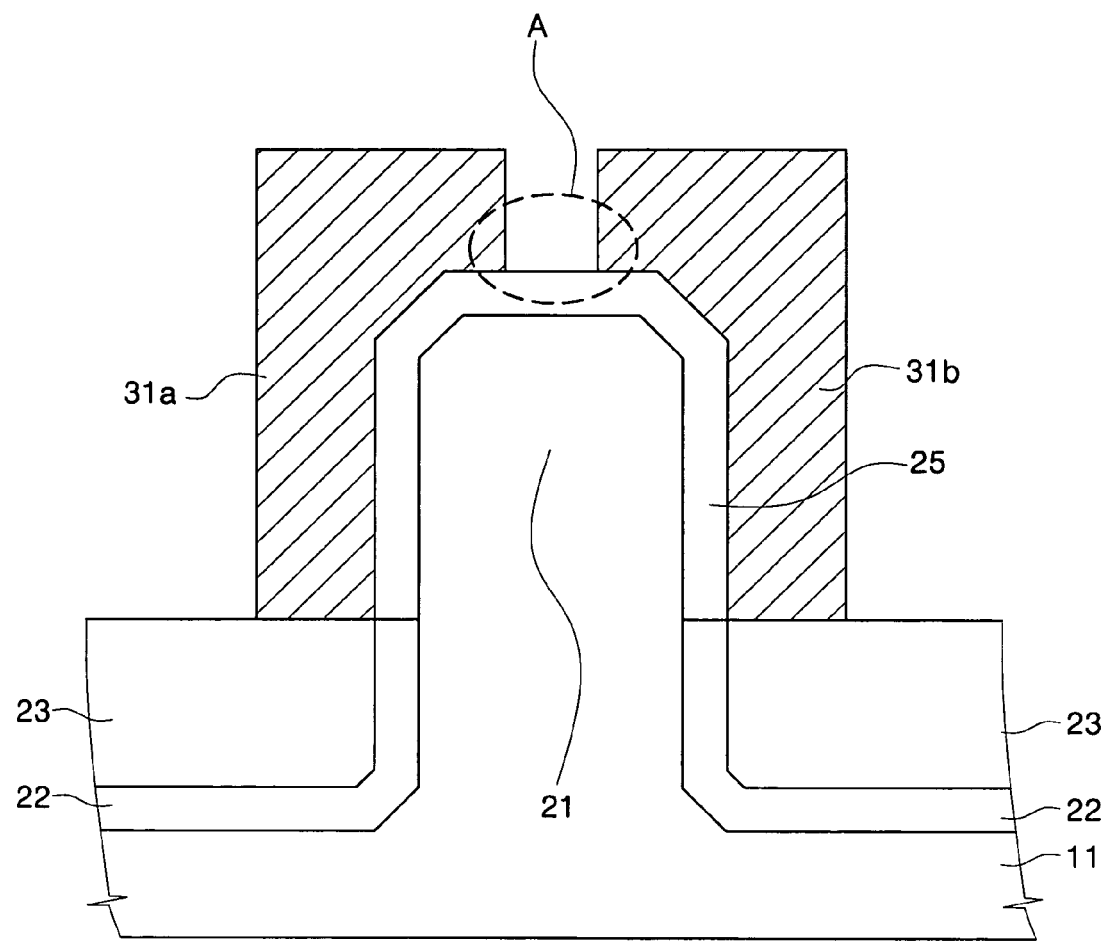
Figure 19:
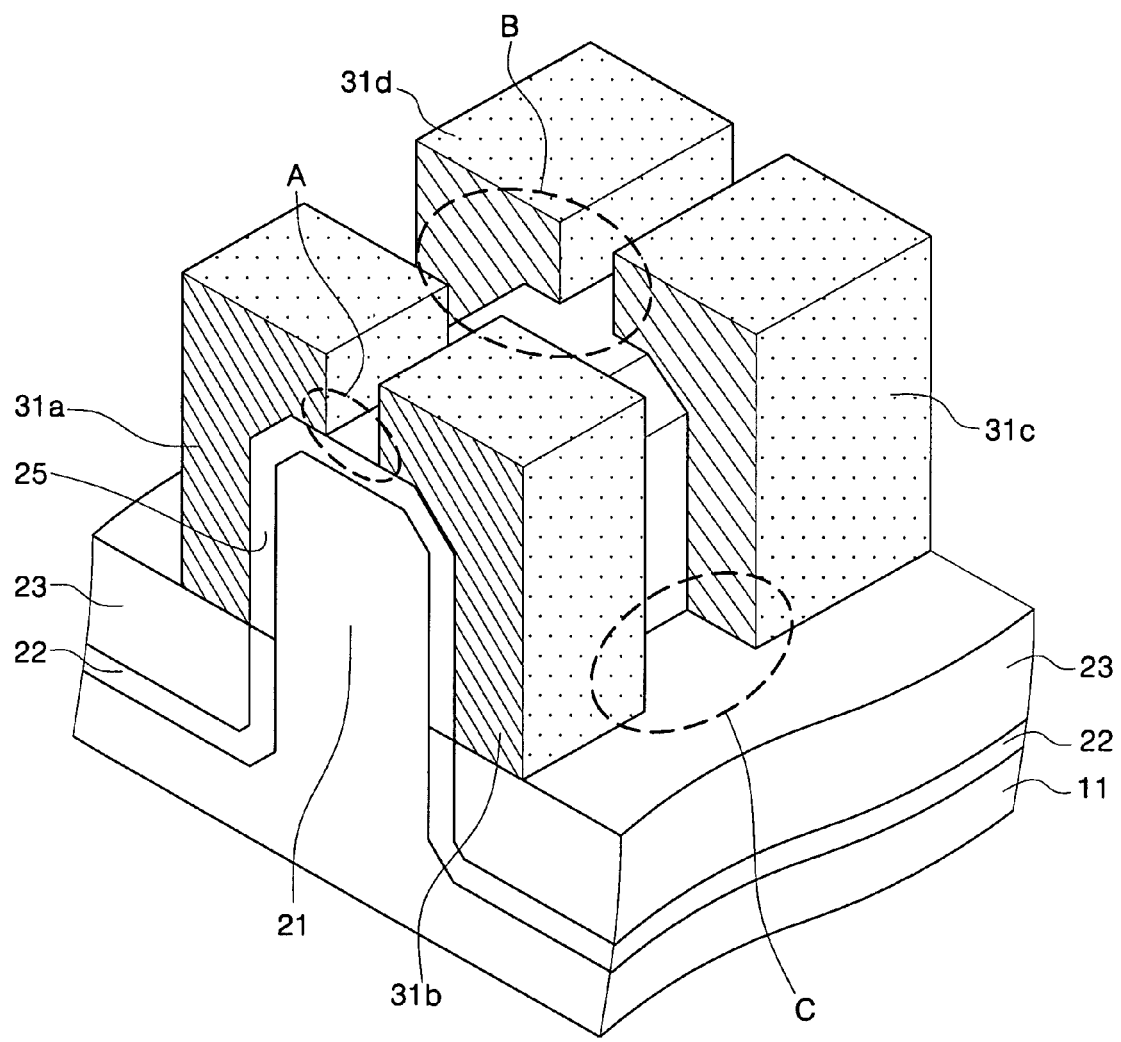

Referring to FIGS. 13, 18, and 19, the floating gate pattern 31a and 31b having the I-shaped groove A is selectively etched using the photoresist pattern 37, the ARC layer, and the groove mask oxide layer 35a as etch masks, thereby forming grooves B and C crossing the fin-type active region 21. Each of the grooves B and C, which crosses over the fin-type active region 21, may be formed to such a depth that the floating gate pattern 31 is completely recessed and the tunnel dielectric layer 25 is exposed. Alternatively, each of the grooves B and C may be formed to such a depth that a portion of the floating gate pattern 31 remains on the tunnel dielectric layer 25.

Thereafter, the photoresist pattern 37, the ARC layer, and the groove mask oxide layer 35a, which are used as the etch mask, are removed, so that a cross (+)-shaped groove A, B, and C is completed, as illustrated by the plan view of FIG. 13 and the perspective view of FIG. 19.

As described above, each of the grooves A and B formed over the top surface of the fin-type active region 21 may be formed to such a depth that the floating gate pattern 31 is completely recessed and the tunnel dielectric layer 25 is exposed. Also, the grooves C formed on sidewalls of the fin-type active region 21 may be formed to such a depth that the floating gate pattern 31 is completely recessed and the tunnel dielectric layer 25 and the trench isolation layers 23 are exposed. When the cross-shaped groove A, B, and C has the greatest depth, the floating gate pattern 31 may be split into a first sub floating gate pattern 31a, a second sub floating gate pattern 31b, a third sub floating gate pattern 31c, and a fourth sub floating gate pattern 31d, which are spaced apart from each other. In this case, as the depth of the cross-shaped groove A, B, and C becomes greater, a coupling ratio becomes higher.

Figure 20:
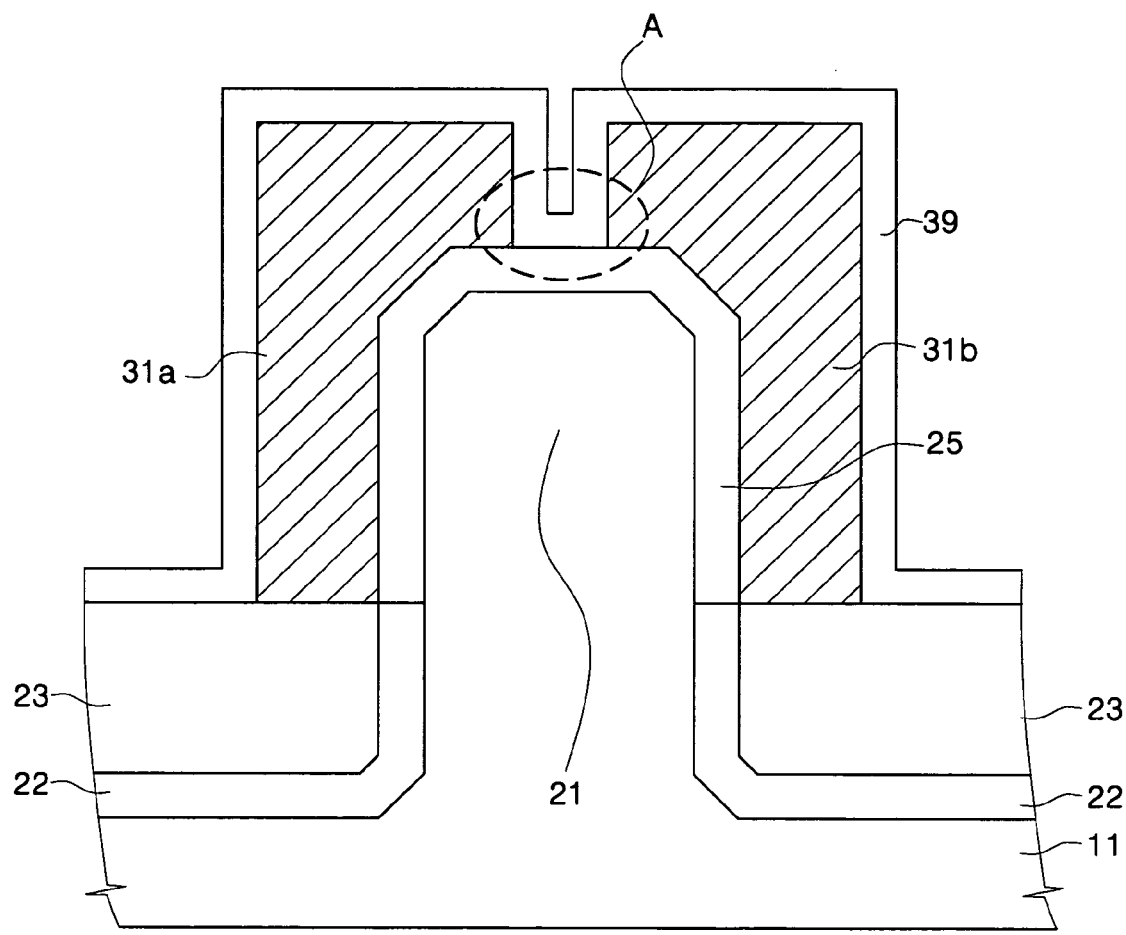
Figure 21:
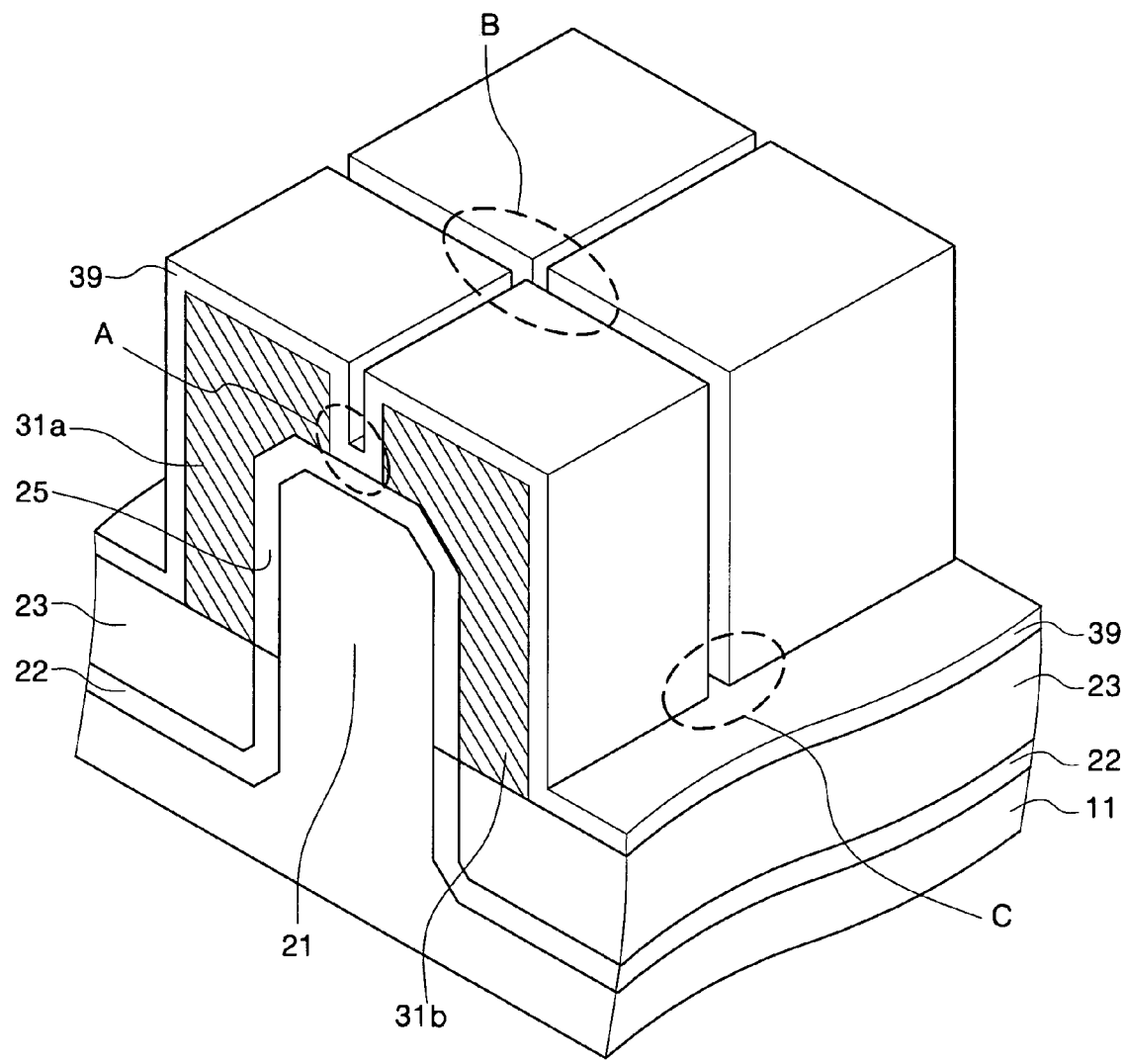
Figure 22:
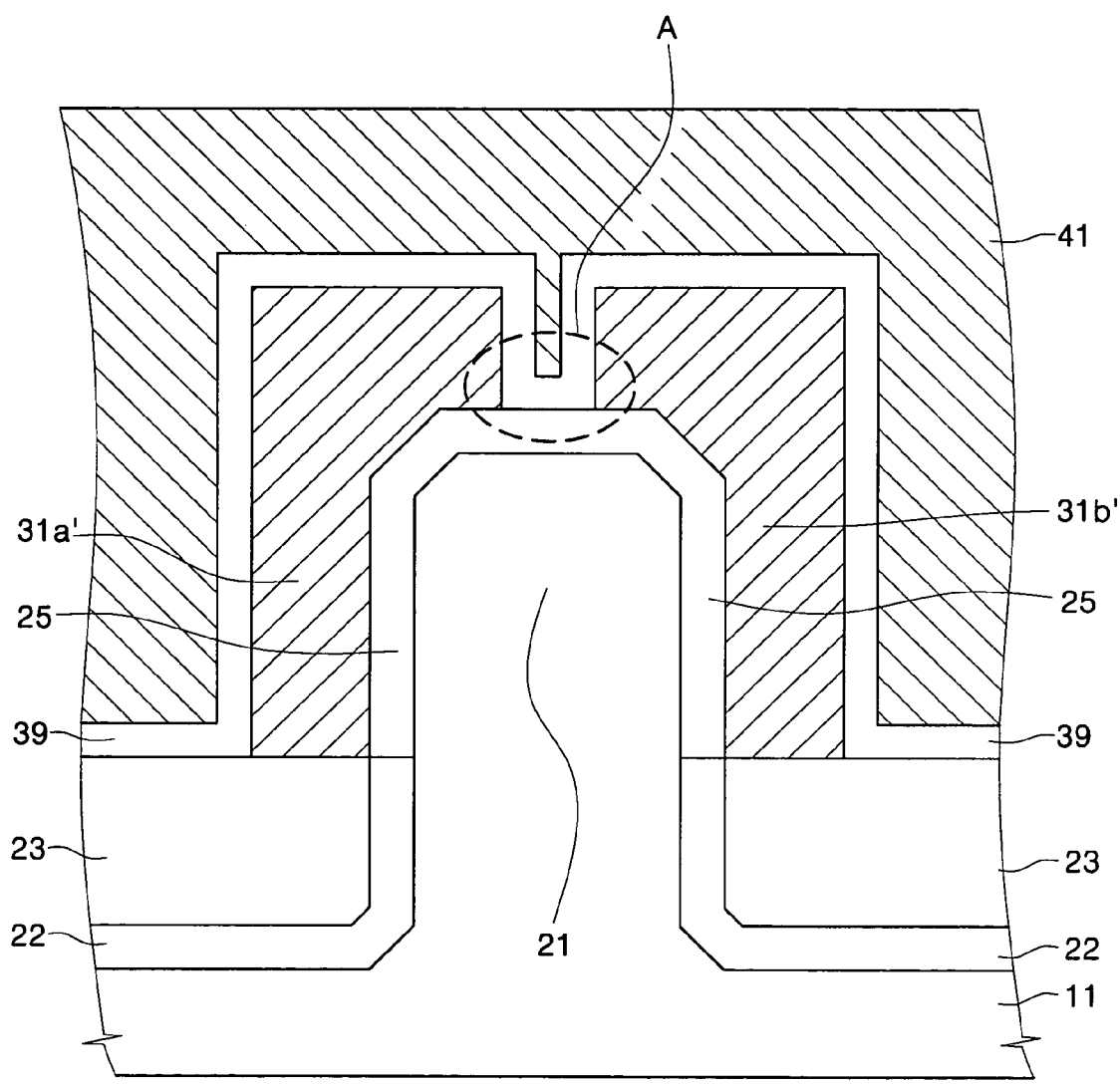

Referring to FIGS. 13, 20, and 21, an inter-gate dielectric layer 39 is conformally formed on the semiconductor substrate 11 having the first sub floating gate pattern 31a, the second sub floating gate pattern 31b, the third sub floating gate pattern 31c, and the fourth sub floating gate pattern 31d. That is, the inter-gate dielectric layer 39 may be conformally deposited to cover inner walls of the cross-shaped groove A, B, and C and also cover the first, second, third, and fourth sub floating gate patterns 31a, 31b, 31c, and 31d. The inter-gate dielectric layer 39 may be formed by sequentially stacking an oxide layer, a nitride layer, and an oxide layer (ONO) on each other. In this case, at least a portion of the inter-gate dielectric layer 39 may be in contact with the tunnel dielectric layer 25.

Referring to FIGS. 13, 22, 23, and 24, a control gate conductive layer (not shown) is deposited on the entire surface of the semiconductor substrate 11 having the inter-gate dielectric layer 39. The control gate conductive layer may be formed to completely fill the cross-shaped groove A, B, and C and cover the entire surface of the semiconductor substrate 11. The control gate conductive layer may be formed of polysilicon. Subsequently, the control gate conductive layer is patterned to form a control gate electrode 41, which fills the cross-shaped groove A, B, and C and crosses over the fin-type active region 21. The control gate electrode 41 is electrically insulated from the first, second, third, and fourth sub floating gate patterns 31a, 31b, 31c, and 31d by the inter-gate dielectric layer 39.

While the control gate electrode 41 is being formed, the inter-gate dielectric layer 39 and the first, second, third, and fourth sub floating gate patterns 31a, 31b, 31c, and 31d are sequentially etched to form a floating gate 31a', 31b', 31c', and 31d' as shown in FIGS. 19, 21 and 23. When the cross-shaped groove A, B, and C has the greatest depth, the floating gate 31a', 31b', 31c', and 31d' may be split into a first sub floating gate 31a', a second sub floating gate 31b', a third sub floating gate 31c', and a fourth sub floating gate 31d'.

Hereinafter, the structure of the above-described flash memory cell having the floating gate 31a', 31b', 31c', and 31d' will be described with reference to FIGS. 13 and 23. Referring to FIGS. 13 and 23, a fin-type active region 21 is provided at a predetermined region of a semiconductor substrate 11. To reduce the electric field crowding, each of upper corners of the fin-type active regions 21 may have a round shape. Trench regions, which are formed by recessing the semiconductor substrate 11, are disposed on both sides of the fin-type active region 21. The fin-type active region 21, which protrudes from the trench regions, has a first sidewall 1, a second sidewall 2, and a top surface 3 disposed therebetween. Lower portions of the trench regions are filled with trench isolation layers 23 from the surface of the semiconductor substrate 11 to a predetermined height that is less than the height of the fin-type active region 21. Trench oxide layers 22 may be interposed between the trench isolation layers 23 and the semiconductor substrate 11. After the lower portions of the trench regions are filled with the trench isolation layers 23, the first and second sidewalls 1 and 2 and top surface 3 of the fin-type active region 21, which are exposed in upper portions of the trench regions, are covered by a tunnel dielectric layer 25. A floating gate 31a', 31b', 31c', and 31d' covers the first and second sidewalls 1 and 2 and top surface 3 of the fin-type active region 21, which are covered by the tunnel dielectric layer 25. The floating gate 31a', 31b', 31c', and 31d' has a cross-shaped groove A, B, and C when seen in the plan view. A control gate electrode 41 completely fills the cross-shaped groove A, B, and C, covers the floating gate 31a', 31b', 31c', and 31d', and crosses over the fin-type active region 21. An inter-gate dielectric layer 39 is interposed between the control gate electrode 41 and the floating gate 31a', 31b', 31c', and 31d'.

The cross-shaped groove A, B, and C may be formed to such a depth that the top surface of the tunnel dielectric layer 25 is exposed. When the cross-shaped groove A, B, and C has the greatest depth, the floating gate 31a', 31b', 31c', and 31d' may be split into a first sub floating gate 31a', a second sub floating gate 31b', a third sub floating gate 31c', and a fourth sub floating gate 31d' by the cross-shaped groove A, B, and C. In this case, the effective area of the inter-gate dielectric layer 39 interposed between the control gate electrode 41 and the floating gate 31a', 31b', 31c', and 31d' is increased due to the cross-shaped groove A, B, and C. On the other hand, the effective area of the tunnel dielectric layer 25 interposed between the fin-type active region 21 and the floating gate 31a', 31b', 31c', and 31d' is reduced due to the cross-shaped groove A, B, and C. In this case, the amount of current in the fin-type active region 21 may be held constant through the influence of the control gate electrode 41 filled in the cross-shaped groove A, B, and C. As a result, a coupling ratio, which is expressed as a ratio of the capacitance of the inter-gate dielectric layer 39 to the sum of the capacitances of the tunnel dielectric layer 25 and the inter-gate dielectric layer 39, may be greatly elevated.

According to the present invention as described above, a groove is provided in a floating gate. Also, a control gate electrode fills the groove and covers the floating gate. Thus, the effective area of an inter-gate dielectric layer interposed between the control gate electrode and the floating gate may be greatly increased, whereas the effective area of a tunnel dielectric layer interposed between a fin-type active region and the floating gate may be decreased. In this case, the amount of current in the fin-type active region may be held constant through the influence of the control gate electrode filled in the groove. As a consequence, a coupling ratio, which is expressed as a ratio of the capacitance of the inter-gate dielectric layer to the sum of the capacitances of the tunnel dielectric layer and the inter-gate dielectric layer, may be notably elevated. This high coupling ratio increases data writing and erasing efficiencies. Thus, a flash memory cell may achieve lower power consumption, higher response speed, and higher integration density.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A non-volatile memory cell, comprising:
    a semiconductor substrate having a fin-shaped active region extending therefrom;
    a tunnel dielectric layer extending on opposing sidewalls and an upper surface of the fin-shaped active region;
    a floating gate electrode having at least a partial groove therein, on said tunnel dielectric layer;
    an inter-gate dielectric layer extending on the floating gate electrode and into the at least a partial groove; and a control gate electrode extending on the inter-gate dielectric layer and into the at least a partial groove;
wherein the at least a partial groove is sufficiently deep to separate the floating gate electrode into at least a pair of sub floating gate patterns; and
wherein inter-gate dielectric layer contacts a portion of said tunnel dielectric layer within the at least a partial groove.

2. The memory cell of claim 1, wherein a portion of said control gate electrode extending into the at least a partial groove is separated from the upper surface of the fin-shaped active region by the tunnel dielectric layer and the inter-gate dielectric layer but not any portion of the floating gate electrode.

3. A non-volatile memory cell, comprising:
a semiconductor substrate having a fin-shaped active region extending therefrom;
a tunnel dielectric layer extending on opposing sidewalls and an upper surface of the fin-shaped active region;
a floating gate electrode having at least a partial groove therein, on said tunnel dielectric layer;
an inter-gate dielectric layer extending on the floating gate electrode and into the at least a partial groove; and
a control gate electrode extending on the inter-gate dielectric layer and into the at least a partial groove;
wherein the at least a partial groove is a cross-shaped groove that extends opposite the sidewalls of the fin-shaped active region.

4. The memory cell of claim 3, wherein the at least a partial groove is sufficiently deep to separate the floating gate electrode into at least four sub floating gate patterns.

5. The memory cell of claim 1, wherein said inter-gate dielectric layer is an oxide-nitride-oxide (ONO) layer.

6. An integrated circuit device, comprising:
a semiconductor substrate; and
a non-volatile memory cell having floating and control gate electrodes separated by an inter-gate dielectric layer and a tunnel dielectric layer extending between the floating gate electrode and said semiconductor substrate, said floating gate electrode having a groove therein into which a portion of the inter-gate dielectric layer and control gate electrode extend, said groove being sufficiently deep to separate the floating gate electrode into at least two sub floating gate patterns.

7. A flash memory cell comprising:
trench regions formed by recessing predetermined regions of a semiconductor substrate and defining a fin-type active region that protrudes from the trench regions, the fin-type active region having a first sidewall and a second sidewall, which face each other, and a top surface disposed therebetween;
trench isolation layers filling lower portions of the trench regions and exposing an upper portion of the fin-type active region;
a floating gate covering the first and second sidewalls and top surface of the exposed portion of the fin-type active region and having a groove therein that is sufficiently deep to separate the floating gate into at least two sub floating gate patterns; and
a control gate electrode filling the groove, covering the floating gate, and crossing over the fin-type active region.

8. The flash memory cell according to claim 7, further comprising a tunnel dielectric layer interposed between the floating gate and the fin-type active region.

9. The flash memory cell according to claim 7, further comprising an inter-gate dielectric layer interposed between the control gate electrode and the floating gate and conformally covering inner walls of the groove.

10. The flash memory cell according to claim 7, wherein the groove is disposed over the fin-type active region and has an "I" shape in a lengthwise direction of the fin-type active region.

11. The flash memory cell according to claim 10, wherein the floating gate includes a first sub floating gate pattern and a second sub floating gate, pattern which are spaced apart from each other by the I-shaped groove.

12. A flash memory cell comprising:
trench regions formed by recessing predetermined regions of a semiconductor substrate and defining a fin-type active region that protrudes from the trench regions, the fin-type active region having a first sidewall and a second sidewall, which face each other, and a top surface disposed therebetween;
trench isolation layers filling lower portions of the trench regions and exposing an upper portion of the fin-type active region;
a floating gate covering the first and second sidewalls and top surface of the exposed portion of the fin-type active region and having a groove; and
a control gate electrode filling the groove, covering the floating gate, and crossing over the fin-type active region;
wherein the groove has a cross (+) shape when seen in a plan view.

13. The flash memory cell according to claim 12, wherein the floating gate includes a first sub floating gate pattern, a second sub floating gate pattern, a third sub floating gate pattern, and a fourth sub floating gate pattern, which are spaced apart from each other by the cross-shaped groove.

* * * * *